(12) United States Patent
Nakayama et al.

(10) Patent No.: US 9,846,201 B2
(45) Date of Patent: *Dec. 19, 2017

(54) SEMICONDUCTOR INTEGRATED CIRCUIT HAVING BATTERY CONTROL FUNCTION AND OPERATION METHOD THEREOF

(71) Applicant: Renesas Electronics Corporation, Kanagawa (JP)

(72) Inventors: Yoko Nakayama, Chiyoda-ku (JP); Takeshi Inoue, Chiyoda-ku (JP)

(73) Assignee: Renesas Electronics Corporation, Tokyo (JP)

( * ) Notice: Subject to any disclaimer, the term of this patent is extended or adjusted under 35 U.S.C. 154(b) by 382 days.

This patent is subject to a terminal disclaimer.

(21) Appl. No.: 14/635,621

(22) Filed: Mar. 2, 2015

(65) Prior Publication Data
US 2015/0177331 A1 Jun. 25, 2015

Related U.S. Application Data

(63) Continuation of application No. 13/478,914, filed on May 23, 2012, now Pat. No. 8,970,174.

(30) Foreign Application Priority Data

May 30, 2011 (JP) .................. 2011-120119

(51) Int. Cl.
*G01R 31/36* (2006.01)
*G06F 1/26* (2006.01)

(52) U.S. Cl.
CPC ....... *G01R 31/3648* (2013.01); *G01R 31/361* (2013.01); *G01R 31/3606* (2013.01);
(Continued)

(58) Field of Classification Search
CPC combination set(s) only.
See application file for complete search history.

(56) References Cited

U.S. PATENT DOCUMENTS 5,539,318 A 7/1996 Sasaki
7,085,661 B2 8/2006 Emori et al.
(Continued)

FOREIGN PATENT DOCUMENTS

JP H09-322420 A 12/1997
JP 2003-178811 A 6/2003
(Continued)

*Primary Examiner* — Mamadou Diallo
(74) *Attorney, Agent, or Firm* — Womble Bond Dickinson (US) LLP

(57) ABSTRACT

A semiconductor integrated circuit is capable of being supplied with battery current information and battery voltage information. The semiconductor integrated circuit includes a memory function, a current integrating function, a voltage-based state of charge operating function, a current-based state of charge operating function, a comparison determination function, a correcting function, and a resistance deterioration coefficient output function. The memory function stores the relation between a state of charge of a battery and an internal resistance deterioration coefficient thereof. The full charge capacity outputted from the correcting function and the internal resistance deterioration coefficient outputted from the resistance deterioration coefficient output function are stored in the memory function when a voltage-based state of charge and a current-based state of charge compared by the comparison determination function are determined to substantially coincide with each other.

10 Claims, 11 Drawing Sheets

(52) U.S. Cl.
CPC ..... *G01R 31/3651* (2013.01); *G01R 31/3662* (2013.01); *G06F 1/263* (2013.01); *G01R 31/3679* (2013.01)

(56) References Cited

U.S. PATENT DOCUMENTS

| | | |
|---|---|---|
| 7,622,894 B2 | 11/2009 | Kawahara et al. |
| 8,466,708 B2 | 6/2013 | Kawahara et al. |
| 2012/0029851 A1* | 2/2012 | Nakayama ......... G01R 31/3624 702/63 |
| 2013/0320989 A1* | 12/2013 | Inoue ................. G01R 31/3624 324/427 |
| 2014/0184169 A1* | 7/2014 | Tsuru .................... B60L 3/0046 320/136 |
| 2014/0253039 A1 | 9/2014 | Barsukov |

FOREIGN PATENT DOCUMENTS

| | | |
|---|---|---|
| JP | 2008-14702 A | 1/2008 |
| JP | 2011-53088 | 3/2011 |

* cited by examiner

A: PROCESS IMMEDIATELY AFTER START OF DISCHARGE

STEP A1: CALCULATE Qmax-R DETERIORATION COEFFICIENT

STEP A2: CALCULATE Qmax@(SOC_I = SOC_V)

B: PROCESS DURING DISCHARGE

STEP B: UPDATE INTERNAL RESISTANCE TABLE 761 (f(SOC))

CALCULATE AMOUNT OF CHARGE SEQUENTIALLY → CALCULATE RSOC, REMAINING CAPACITY AND REMAINING TIME SEPARATELY $$SOC = SOC\_ini - \frac{Q_{use}}{Q_{max}} * 100 \quad \ldots \text{(EQUATION 5)}$$

C: PROCESS AFTER COMPLETION OF DISCHARGE

STEP C: UPDATE Qmax-R DETERIORATION COEFFICIENT

SEMICONDUCTOR INTEGRATED CIRCUIT HAVING BATTERY CONTROL FUNCTION AND OPERATION METHOD THEREOF

CROSS-REFERENCE TO RELATED APPLICATIONS

This is a Continuation of U.S. patent application Ser. No. 13/748,914, filed May 23, 2012, now U.S. Pat. No. 8,970,174, which claims priority to Japanese Patent Application No. 2011-120119 filed on May 30, 2011. The contents of the aforementioned applications are incorporated herein by reference in their entirety.

BACKGROUND

The present invention relates to a semiconductor integrated circuit having a battery control function and an operation method thereof, and particularly to a technology effective in making it possible to shorten the time taken to calculate a full charge capacity Qmax and an internal resistance value being parameters related to deterioration of a battery.

Portable equipment for consumer use such as a notebook personal computer (hereinafter referred to as "note PC"), a cellular phone, a smart phone or the like needs to notify battery's characteristic information about the degree of deterioration of a secondary battery used as a power supply, the remaining capacity and time of the battery at its discharge, or the remaining capacity and time thereof at its charge, or the like to a user.

The following Patent Document 1 has described that a remaining capacity SOCc based on current integration in which charging and discharging currents of a battery are integrated, and a remaining capacity SOCv based on an estimated value of an open voltage of the battery are weighted to calculate a combined remaining capacity SOC. Further, a current capacity change rate σ is calculated from a change ΔSOCc in the remaining capacity based on the current integration and a change ΔSOC in the combined remaining capacity. When the current capacity change rate σ reaches a predetermined value or less, it is determined that the deterioration of the battery has occurred. Incidentally, the remaining capacity (SOC) is called a charge rate or a state of charge.

The following Patent Document 2 has described a method of determining the deterioration of a battery using a state of charge (SOC) calculated by integrating charging and discharging currents of the battery. A current-based state of charge (ISOC) is generated from the charging and discharging currents of the battery, and a voltage-based state of charge (VSOC) is calculated from the voltage of the battery. When the value of either of them is high, the current-based state of charge (ISOC) is subtracted from the voltage-based state of charge (VSOC). When the subtracted value exceeds a first threshold value or when the subtracted value is less than a second threshold value where the value of either of the two is low, an additional value is added to a deterioration coefficient to modify the deterioration coefficient. When the deterioration coefficient exceeds a third threshold value, it is determined that the battery has been deteriorated.

The following Patent Document 3 has described a method of performing an arithmetic operation on a charging time up to the end of charge where a secondary battery is charged by constant current/voltage charge. An open voltage for the secondary battery is detected. A constant current charging time is calculated from the open voltage and a voltage drop developed across an internal resistance of the secondary battery at the constant current charge. A constant voltage charging time is calculated from a voltage drop developed across the internal resistance. Then, a charging time taken up to the end of its charge is arithmetically operated from the two.

The following Patent Document 4 has described a method of calculating a relative remaining capacity of a secondary battery and a full charge capacity thereof. First, a relative remaining capacity SOCfull is calculated from a reference table in accordance with an open circuit voltage OCVfull in the fully charged state of the secondary battery. Thereafter, a relative remaining capacity SOC determined from the reference table in accordance with an open circuit voltage OCV detected upon the stop of discharge of the secondary battery is corrected based on the relative remaining capacity SOCfull in the fully charged state, whereby a true relative remaining capacity SOCtrue is determined. Further, a discharging current of the secondary battery is integrated to determine a discharge capacity Q [Ah] from the fully charged state of the secondary battery to its discharge stop. A full charge capacity Qfull of the secondary battery is determined as Qfull=Q÷[(100−SOCtrue)/100] based on the discharge capacity Q and the true relative remaining capacity SOCtrue. A method of calculating the full charge capacity Qfull is however a general method.

RELATED ART DOCUMENTS

Patent Documents

[Patent Document 1] Japanese Patent Laid-Open No. 2008-14702
[Patent Document 2] Japanese Patent Laid-Open No. 2003-178811
[Patent Document 3] Japanese Patent Laid-Open No. Hei 9(1997)-322420
[Patent Document 4] Japanese Patent Laid-Open No. 2011-53088

The technology described in the Patent Document 1 has shown that the degree of deterioration of the battery is determined from the current capacity change rate σ. As described below, however, the present technology is not capable of calculating the full charge capacity Qmax and the internal resistance for making it possible to display the accurate remaining capacity of the battery.

In the technology described in the Patent Document 2, when the current-based state of charge (ISOC) is subtracted from the voltage-based state of charge (VSOC) and the subtracted value is not greater than the first threshold value where the value of either of both the current-based state of charge (ISOC) and the voltage-based state of charge (VSOC) is high, it is determined whether the subtracted value is less than a fourth threshold value smaller than the absolute value of the first threshold value. When the subtracted value is of the fourth threshold value, the current-based state of charge (ISOC) is decided as a battery's state of charge (SOC). Further, when the voltage-based state of charge (VSOC) is subtracted from the current-based state of charge (ISOC) and the subtracted value is greater than or equal to the second threshold value where the value of either of both the current-based state of charge (ISOC) and the voltage-based state of charge (VSOC) is low, the current-based state of charge (ISOC) is decided as a battery's state of charge (SOC). Since the technology described in the Patent Document 2 executes the complicated determination process as described above, a calculation convergence time is required for execution of calculations. The technology described in the Patent Document 2 is provided assuming a battery mounted in an electric vehicle (EV), a hybrid electric vehicle (HEV), etc. It is possible for a semiconductor integrated circuit for battery control used in this field to shorten the calculation convergence time with an increase in the processing speed. It has however been clear as a result of studies by the present inventors prior to the present invention that it is not easy for a semiconductor integrated circuit for battery control used in the field of portable equipment for consumer use such as a notebook PC or the like to shorten the calculation convergence time.

A specification called a smart battery system (SBS) has recently been established in the field of the notebook PC. Described concretely, an electronic circuit board built in a battery pack is used and equipped with a function for an accurate remaining capacity indicator and a function for a safety circuit or the like relative to overdischarge.

In order to display the accurate remaining capacity of the battery of the smart battery system (SBS), there is a need to calculate a full charge capacity Qmax and an internal resistance as will be described in detail later. A full charge capacity Qmax mentioned in the specification of the present application indicates a capacity taken until a final discharge voltage is reached where the battery is discharged with an extremely small current ($\approx 0$).

It is however possible for the technology described in the Patent Document 2 to calculate the deterioration coefficient of the battery but impossible therefor to calculate the full charge capacity Qmax and the internal resistance.

On the other hand, the technology described in the Patent Document 3 performs the arithmetic operation on the charging time up to the end of charge of the secondary battery where the secondary battery is charged by the constant current/voltage charge, but is nevertheless not capable of calculating the full charge capacity Qmax. Further, the technology described in the Patent Document 3 makes use of a charging time table in which times taken until the open voltage of the secondary battery reaches a full charge voltage are tabularized, when the constant voltage charging time is calculated based on an exponential function to which a change in the open voltage of the secondary battery is made approximate. Thus, there is a need to provide a nonvolatile memory having a large storage capacity in order to realize the charging time table by an actual semiconductor integrated circuit for battery control.

On the other hand, the technology described in the Patent Document 4 is accompanied by problems that it is capable of calculating the full charge capacity but needs to cause the secondary battery to definitely reach the fully charged state, and an accurate calculation cannot be made where the secondary battery is not fully charged in practical use.

The present invention has been made as a result of studies by the present inventors prior to the present invention, such as described above.

SUMMARY

An object of the present invention is therefore to enable shortening of time taken to calculate a full charge capacity Qmax and an internal resistance that change depending on the deterioration of a battery.

Another object of the present invention is to improve the accuracy of estimation of a remaining capacity of a battery.

The above and other objects and novel features of the present invention will be apparent from the description of the present specification and the accompanying drawings.

Typical ones of the inventive aspects of the invention disclosed in the present application will be briefly described as follows:

A typical embodiment of the present invention is a semiconductor integrated circuit (703) having a battery control function capable of controlling at least either one of discharge and charge operations of a battery (702).

The semiconductor integrated circuit is capable of being supplied with current information generated from a current detection unit (706) for detecting a current of the battery and voltage information generated from a voltage detection unit (705) for detecting a voltage of the battery.

The semiconductor integrated circuit is equipped with a memory function (719), a current integrating function (765), a voltage-based state of charge operating function (764), a current-based state of charge operating function (766), a comparison determination function (767), a correcting function (769), and a resistance deterioration coefficient output function (768).

The memory function is capable of storing therein a relation between a full charge capacity (Qmax) of the battery and an internal resistance deterioration coefficient ($C_{Deg}$) of the battery.

The full charge capacity outputted from the correcting function and the internal resistance deterioration coefficient outputted from the resistance deterioration coefficient output function can be stored in the memory function in a state in which a voltage-based state of charge and a current-based state of charge compared with each other by the comparison determination function are determined to substantially coincide with each other (refer to FIG. 4).

Further, another typical embodiment of the present invention is an operation method of a semiconductor integrated circuit (703) having a battery control function capable of controlling at least either one of discharge and charge operations of a battery (702).

The semiconductor integrated circuit is equipped with a memory function (719), a current integrating function (765), a voltage-based state of charge operating function (764), a current-based state of charge operating function (766), a comparison determination function (767), a correcting function (769), and a resistance deterioration coefficient output function (768).

The operation method includes a step of storing a relation between a full charge capacity (Qmax) of the battery and an internal resistance deterioration coefficient ($C_{Deg}$) of the battery in the memory function, a step of supplying current information generated from a current detection unit (706) for detecting a current of the battery and voltage information generated from a voltage detection unit (705) for detecting a voltage of the battery to the semiconductor integrated circuit respectively, and a step of storing in the memory function, the full charge capacity outputted from the correcting function and the internal resistance deterioration coefficient outputted from the resistance deterioration coefficient output function in a state in which it is determined that a voltage-based state of charge and a current-based state of charge compared with each other by the comparison determination function substantially coincide with each other (refer to FIG. 4).

An advantageous effect obtained by a typical one of the inventive aspects of the invention disclosed in the present application will briefly be explained as follows:

According to the present invention, it is possible to shorten the time taken to calculate a full charge capacity Qmax and an internal resistance that change depending on the deterioration of a battery.

DETAILED DESCRIPTION

1. Summary of the Embodiments

Figure 1:
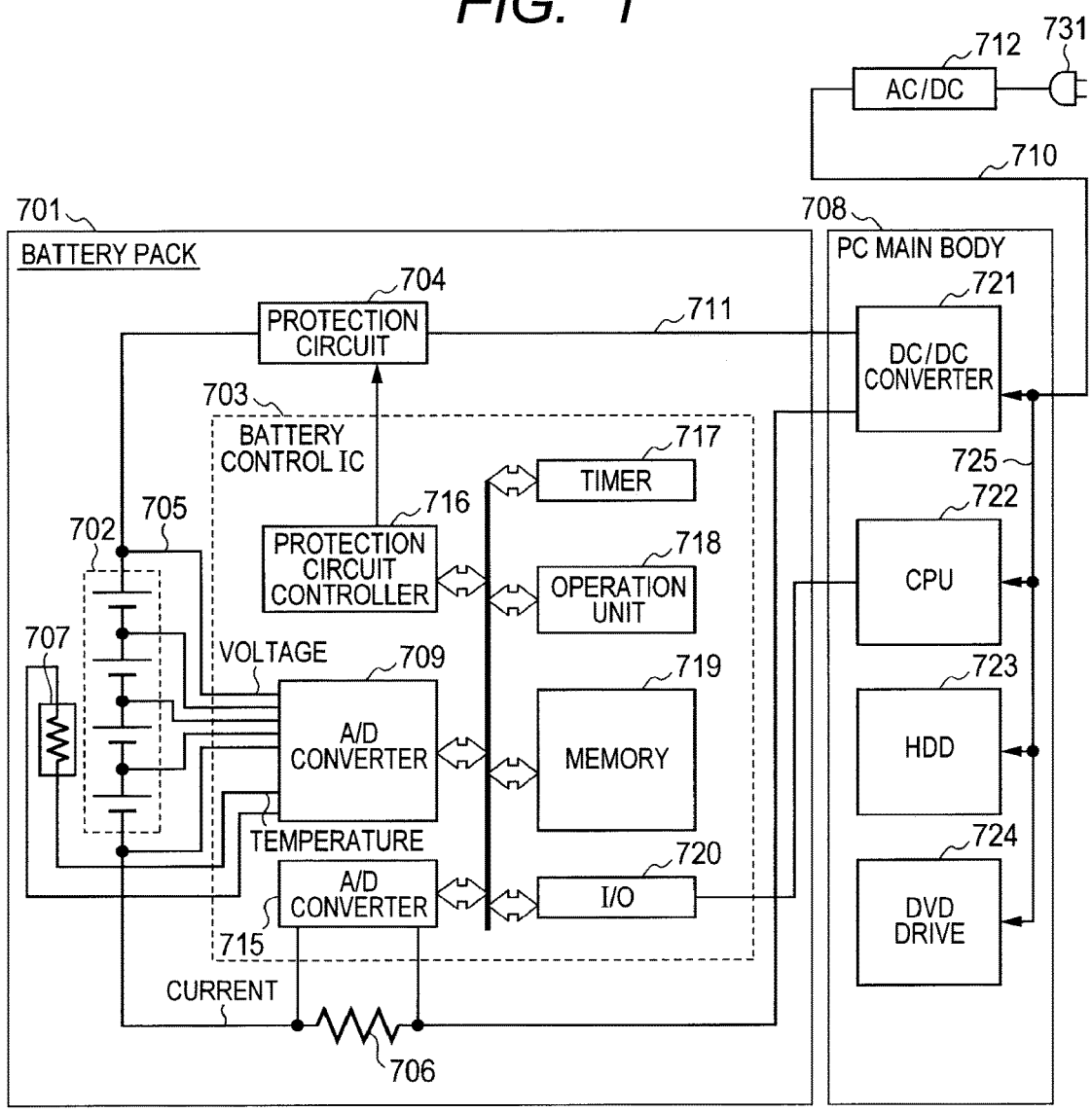
FIG. 1 is a diagram showing a configuration of a semiconductor integrated circuit 703 for battery control, according to a first embodiment of the present invention.

A summary of typical embodiments of the invention disclosed in the present application will first be explained.

Reference numerals of the accompanying drawings referred to with parentheses in the description of the summary of the typical embodiments only illustrate elements included in the concept of components to which the reference numerals are given.

[1] A typical embodiment of the present invention is a semiconductor integrated circuit (703) having a battery control function capable of controlling at least either one of discharge and charge operations of a battery (702).

The semiconductor integrated circuit is capable of being supplied with current information generated from a current detection unit (706) which detects a current of the battery and voltage information generated from a voltage detection unit (705) which detects a voltage of the battery.

The semiconductor integrated circuit is equipped with a memory function (719), a current integrating function (765), a voltage-based state of charge operating function (764), a current-based state of charge calculating function (766), a comparison determination function (767), a correcting function (769), and a resistance deterioration coefficient output function (768).

The memory function is capable of storing the relationship between a full charge capacity (Qmax) of the battery and an internal resistance deterioration coefficient ($C_{Deg}$) of the battery.

Figure 4:
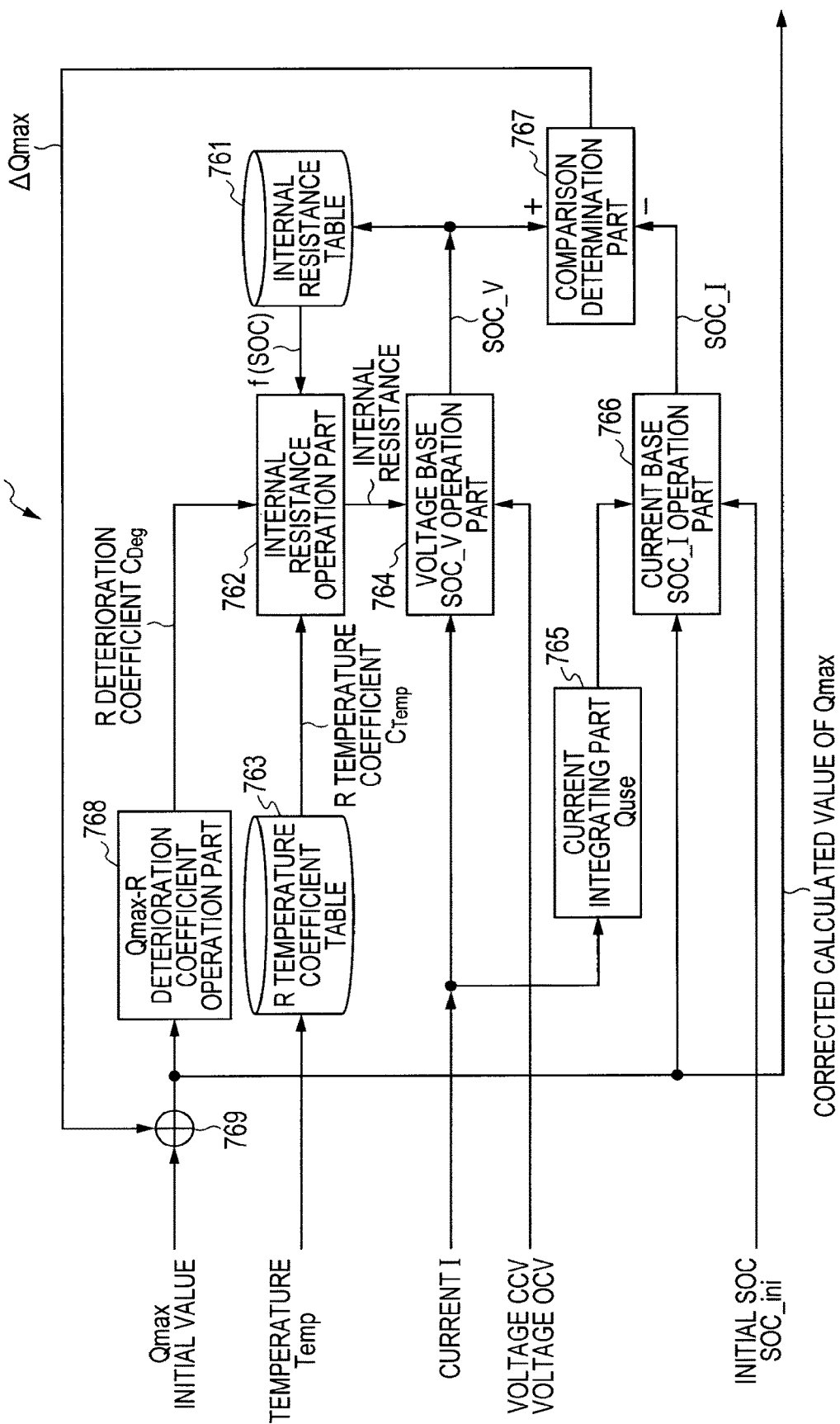
FIG. 4 is a diagram for describing the function of an operation unit 718 of the semiconductor integrated circuit 703 for battery control according to the first embodiment of the present invention shown in FIG. 1.

In a state in which it is determined that a voltage-based state of charge and a current-based state of charge compared with each other by the comparison determination function are determined to have coincided with each other, the full charge capacity outputted from the correcting function and the internal resistance deterioration coefficient outputted from the resistance deterioration output function can be stored in the memory function (refer to FIG. 4).

According to the above embodiment, it is possible to shorten the time taken to calculate a full charge capacity Qmax and an internal resistance that change depending on the deterioration of the battery.

In a preferred embodiment, the memory function is capable of storing an initial value of the full charge capacity and an initial value of the current-based state of charge therein.

The current integrating function is supplied with the current information to thereby enable a current integrated value to be outputted therefrom.

The voltage-based state of charge operating function is supplied with the current information and the voltage information to thereby enable a voltage-based state of charge (SOC_V) to be outputted therefrom.

The current-based state of charge operating function is supplied with the initial value of the full charge capacity and the initial value of the current-based state of charge both outputted from the memory function respectively, and the current integrated value outputted from the current integrating function to thereby enable a current-based state of charge (SOC_I) to be outputted therefrom.

The comparison determination function is supplied with the voltage-based state of charge and the current-based state of charge respectively to thereby enable a comparison output signal (ΔQmax) corresponding to a difference between the voltage-based state of charge and the current-based state of charge to be outputted therefrom.

The correcting function is supplied with the comparison output signal outputted from the comparison determination function and the initial value of the full charge capacity outputted from the memory function to thereby enable a corrected calculated value of the full charge capacity to be outputted therefrom.

The resistance deterioration coefficient output function is capable of outputting the internal resistance deterioration coefficient in response to the corrected calculated value of the full charge capacity outputted from the correcting function.

Figure 6:
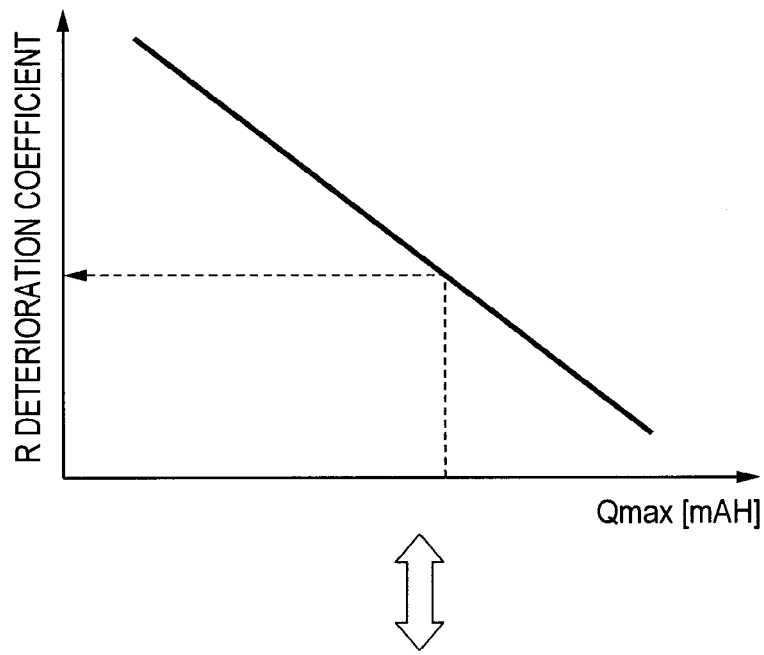
FIG. 6 is a diagram for describing an operation of the operation unit 718 shown in FIG. 4, of the semiconductor integrated circuit 703 for battery control according to the first embodiment of the present invention.
Figure 6:
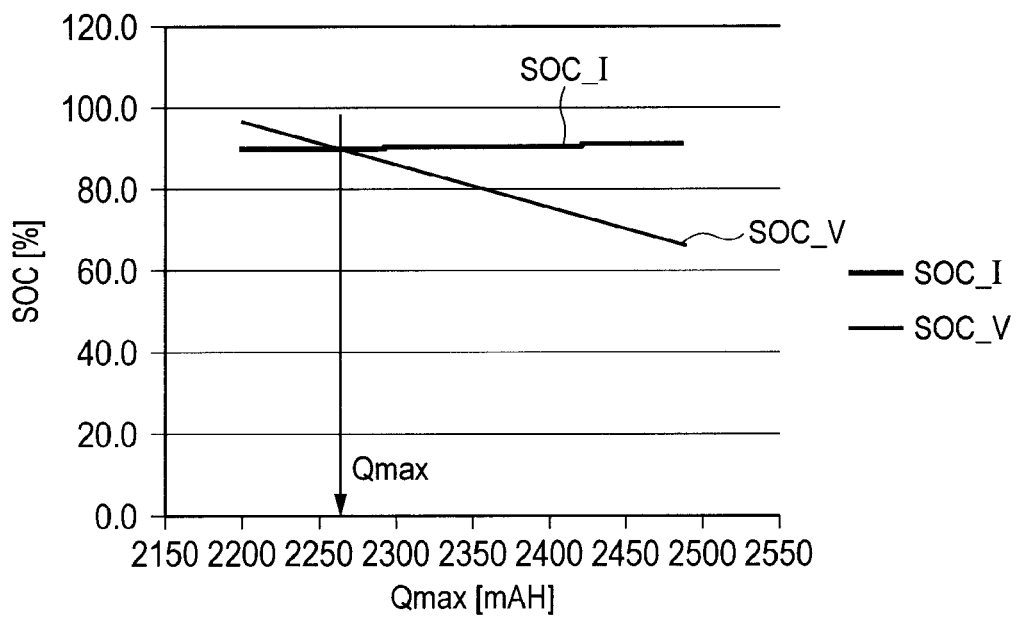

Immediately after the start of the discharge operation, the memory function is capable of storing therein the corrected calculated value of the full charge capacity outputted from the correcting function in the state in which the voltage-based state of charge and the current-based state of charge substantially coincide with each other, and either one of the voltage-based state of charge and the current-based state of charge in the state in which the voltage-based state of charge and the current-based state of charge substantially coincide with each other as the initial value of the full charge capacity and the initial value of the current-based state of charge, respectively (refer to FIG. 6).

In another preferred embodiment, the semiconductor integrated circuit further includes a resistance parameter output function (761).

The resistance parameter output function is comprised of a table indicative of a relation (f(SOC)) between the voltage-based state of charge outputted from the voltage-based state of charge operating function and an internal resistance of the battery. The resistance parameter output function is capable of outputting a resistance parameter (f(SOC)) of the internal resistance of the battery in response to the voltage-based state of charge outputted from the voltage-based state of charge operating function.

During the continuation of discharge of the battery, the internal resistance of the battery is calculated based on a closed-circuit voltage of the battery generated from the voltage detection unit and a discharging current of the battery generated from the current detection unit.

Figure 7:
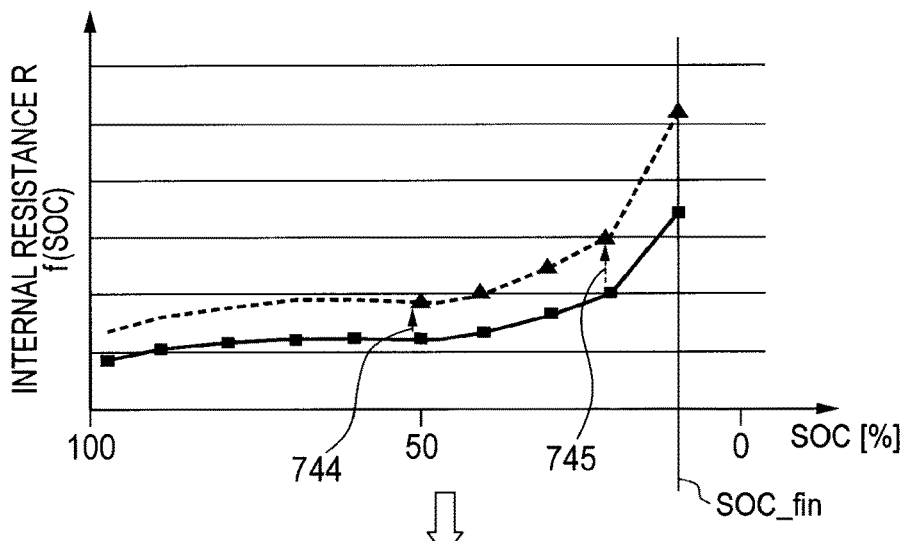
FIG. 7 is a diagram for describing a preferred operation of the operation unit 718 shown in FIG. 4, of the semiconductor integrated circuit 703 for battery control according to the first embodiment of the present invention.

A method of outputting the resistance parameter of the internal resistance of the battery from the resistance parameter output function can be updated in accordance with the result of calculation of the internal resistance of the battery during the continuation of the discharge of the battery (refer to FIG. 7).

Further, in a further preferred embodiment, the full charge capacity of the battery is calculated based on a state of charge calculated based on an open-circuit voltage of the battery generated from the voltage detection unit when a few hours have elapsed after the end of discharge of the battery, and an integrated value of the discharging current of the battery generated from the current detection unit during the discharge of the battery.

The internal resistance deterioration coefficient is calculated based on current and voltage values of the battery during the discharge of the battery.

The relation between the full charge capacity and the internal resistance deterioration coefficient both stored in the memory function is capable of being updated based on the result of calculation of the full charge capacity when the few hours have elapsed after the end of discharge of the battery, and the result of calculation of the internal resistance deterioration coefficient during the discharge of the battery.

In a more preferred embodiment, the semiconductor integrated circuit calculates a state of charge available, a remaining capacity and a remaining time of the battery, based on the full charge capacity and the internal resistance deterioration coefficient (refer to FIG. 7).

In another more preferred embodiment, immediately after the start of the charge operation, the corrected calculated value of the full charge capacity outputted from the correcting function in the state in which the voltage-based state of charge and the current-based state of charge substantially coincide with each other, and either one of the voltage-based state of charge and the current-based state of charge in the state in which the voltage-based state of charge and the current-based state of charge substantially coincide with each other are respectively stored in the memory function as the initial value of the full charge capacity and the initial value of the current-based state of charge.

In a further more preferred embodiment, during the continuation of discharge of the battery, the internal resistance of the battery is calculated based on the closed-circuit voltage of the battery generated from the voltage detection unit and the discharging current of the battery generated from the current detection unit.

The method of outputting the resistance parameter of the internal resistance of the battery at the resistance parameter output function is capable of being updated in accordance with the result of calculation of the internal resistance of the battery during the continuation of the discharge of the battery.

In a still further more preferred embodiment, when a few hours have elapsed after the end of charge of the battery, the full charge capacity of the battery is calculated based on the state of charge calculated based on the open-circuit voltage of the battery generated from the voltage detection unit, and the integrated value of the charging current of the battery generated from the current diction unit during the charge of the battery.

The internal resistance deterioration coefficient is calculated based on the current and voltage values of the battery during the charge of the battery.

The relation between the full charge capacity and the internal resistance deterioration coefficient stored in the memory function is capable of being updated based on the result of calculation of the full charge capacity when the few hours have elapsed after the end of charge of the battery, and the result of calculation of the internal resistance deterioration coefficient during the charge of the battery.

In another more preferred embodiment, as the charge operation, the charge of a constant current is executed in the first half of the charge, and the charge of a constant voltage is executed in the latter half of the charge.

A state of charge (SOC_change) at a change point when the constant current charge is switched to the constant voltage charge is calculated to thereby calculate a constant current charging time (Tcc) for the constant current charge and a constant voltage charging time (Tcv) for the constant voltage charge. An added value of the constant current charging time and the constant voltage charging time is outputted as a remaining charge time (Tcg) (refer to FIGS. 9 through 12).

Figure 11:
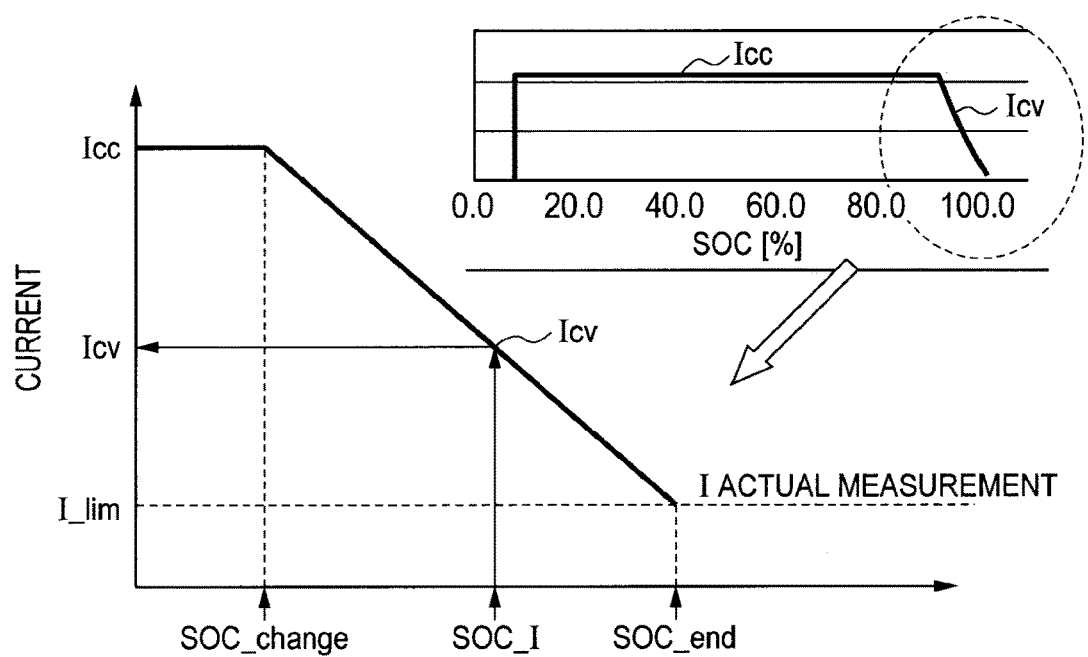
FIG. 11 is a diagram for describing in further detail the linear approximation method used when the charging time Tcv for the constant voltage discharge (CV charge) shown in FIG. 9 is calculated.

In a further more preferred embodiment, the relation between the state of charge of the battery and the charging current for the constant voltage charge is made to a linear approximation upon the calculation of the constant voltage charging time to thereby calculate the constant voltage charging time (refer to FIG. 11).

In a concrete embodiment, a method for calculating the change-point state of charge executes at least either the calculation of the change-point state of charge with a timing at which the closed-circuit voltage taken during the period of the constant voltage charge of the battery coincides with a limit voltage (V_lim) for the constant voltage charge or the calculation of the change-point state of charge with a timing at which the charging current taken during the period of the constant voltage charge of the battery coincides with a constant current (Icc) for the constant current charge.

The semiconductor integrated circuit updates the change-point state of charge calculated by the calculation method to the value of an actual change-point state of charge calculated based on a change from the constant current charge to the constant voltage charge during the actual charge of the battery.

Figure 12:
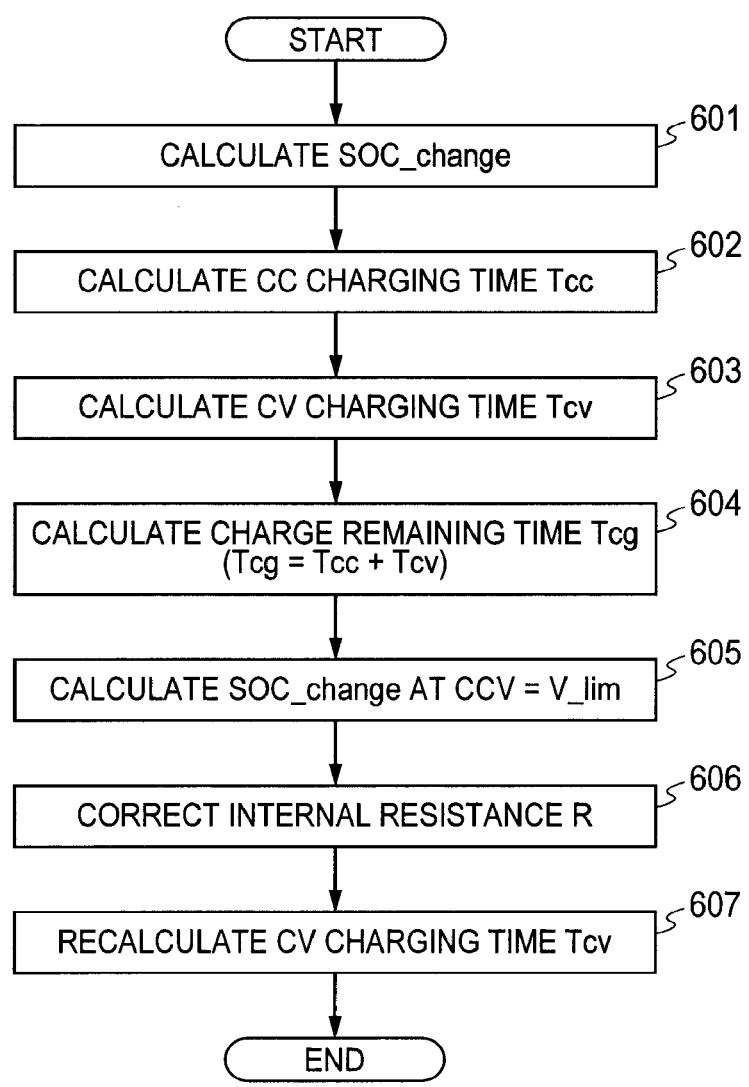
FIG. 12 is a diagram showing a flowchart for calculating a remaining charge time of the battery 702 using the semiconductor integrated circuit 703 for battery control shown in FIG. 1.

The semiconductor integrated circuit recalculates the constant voltage charging time by using the value of the actual change-point state of charge to thereby update an output value of the remaining charging time (refer to FIG. 12).

In the most concrete embodiment, the memory function is achieved by a nonvolatile memory built in the semiconductor integrated circuit.

[2] A typical embodiment according to another aspect of the present invention is an operation method of a semiconductor integrated circuit (703) having a battery control function capable of controlling at least either one of discharge and charge operations of a battery (702).

The semiconductor integrated circuit is equipped with a memory function (719), a current integrating function (765), a voltage-based state of charge operating function (764), a current-based state of charge operating function (766), a comparison determination function (767), a correcting function (769), and a resistance deterioration coefficient output function (768).

The operation method includes the steps of storing a relation between a full charge capacity (Qmax) of the battery and an internal resistance deterioration coefficient ($C_{Deg}$) of the battery in the memory function, supplying current information generated from a current detection unit (706) for detecting a current of the battery and voltage information generated from a voltage detection unit (705) for detecting a voltage of the battery to the semiconductor integrated circuit respectively, and storing in the memory function, the full charge capacity outputted from the correcting function and the internal resistance deterioration coefficient outputted from the resistance deterioration coefficient output function in a state in which it is determined that a voltage-based state of charge and a current-based state of charge compared with each other by the comparison determination function substantially coincide with each other (refer to FIG. 4).

2. Further Detailed Description of the Embodiments

Embodiments will next be explained in further detail. Incidentally, in all of the drawings for explaining the best modes for carrying out the invention, the same reference numerals are respectively attached to components having the same function as in the drawings, and their repetitive description will be omitted.

[First Embodiment] <<Configuration of Semiconductor Integrated Circuit for Battery Control>>

FIG. 1 is a diagram showing a configuration of a semiconductor integrated circuit 703 for battery control according to a first embodiment of the present invention.

FIG. 1 shows not only the semiconductor integrated circuit 703 but also a battery pack 701, a note PC 708 and an AC/DC converter 712.

The battery pack 701 is comprised of a battery 702 having three series couplings or four series couplings, the semiconductor integrated circuit 703 for battery control, a protection circuit 704, a voltage detection unit 705, a current detection unit 706, and a temperature detection unit 707. In the example illustrated in FIG. 1, the battery 702 has a plurality of battery cells coupled in series.

The semiconductor integrated circuit 703 is comprised of a first A/D converter 709, a second A/D converter 715, a protection circuit controller 716, a timer 717, an operation part 718, a memory 719 and an input/output unit 720. The protection circuit controller 716 is coupled to the protection circuit 704 and controls the protection circuit 704. Since the input/output unit 720 is coupled to the note PC 708, the semiconductor integrated circuit 78034 executes the transfer of data through the note PC 708 and the input/output unit 720. The operation part 718 can be configured by a central processing unit (CPU). The memory 719 includes a volatile memory such as an SRAM for the central processing unit (CPU) of the operation part 718, and a nonvolatile memory such as a flash memory or the like.

As shown in FIG. 1, a power system of the note PC 708 includes first path 710 that supplies power from an AC power supply 731 to the note PC 708 via the AC/DC converter 712, and second path 711 that supplies power from the battery 702 through the DC/DC converter 721 upon non-coupling of the AC power supply 731. Even in the case of both of the first path 710 and the second path 711, power is supplied from a route 725 to the respective units such as a central processing unit (CPU) 722, a hard disk drive (HDD) 723, a DVD drive 724 and the like of the note PC 708. During the charge of the battery 702, the battery 702 is charged from the AC power supply 731 via the AC/DC converter 721, the first path 710, the DC/DC converter 721 and the second path 711.

Figure 2:
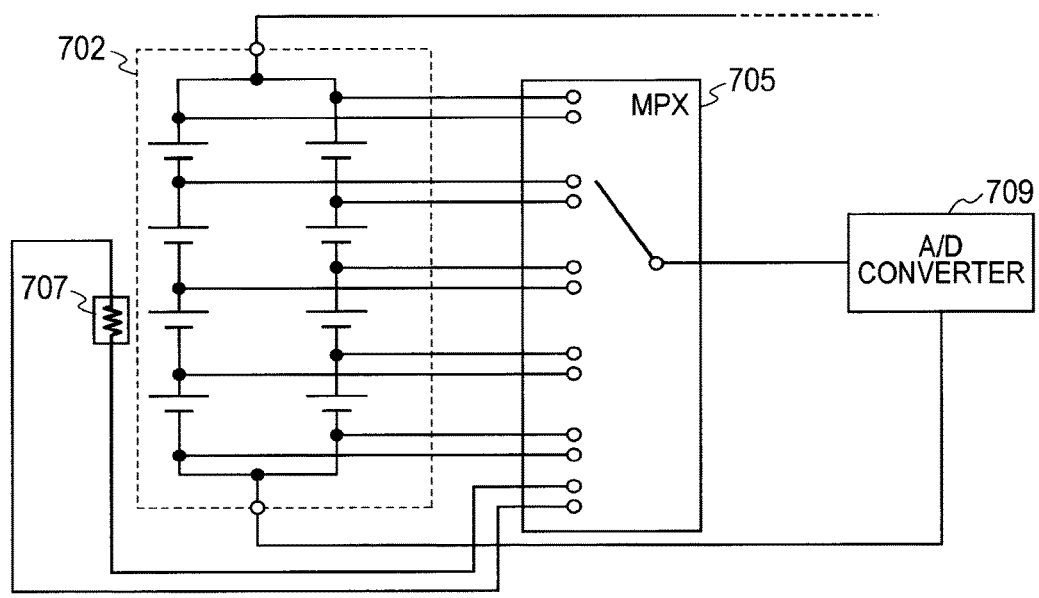
FIG. 2 is a diagram illustrating a configuration of a voltage detection unit 705 of the semiconductor integrated circuit 703 for battery control shown in FIG. 1 and a configuration of a battery 702 thereof.

FIG. 2 is a diagram showing a configuration of the voltage detection unit 705 for the semiconductor integrated circuit 703 shown in FIG. 1, and a configuration of the battery 702 therefor.

As shown in FIG. 2, the battery 702 is comprised of a plurality of battery cells coupled in series, which take the form of series couplings prepared in plural form and take the form of parallel couplings of such series couplings. The voltage detection unit 705 is comprised of a multi-input/one-output multiplexer MPX configured so as to be capable of selecting an arbitrary coupling node of the battery 702 and supplying power to an analog input terminal of the first A/D converter 709. The multi-input terminals of the multiplexer MPX are coupled to a plurality of coupling nodes of the battery 702. The single output terminal of the multiplexer MPX is coupled to the analog input terminal of the first A/D converter 709.

The semiconductor integrated circuit 703 shown in FIG. 1 is coupled to the voltage detection unit 705, the current detection unit 706 and the temperature detection unit 707. The voltage detection unit 705 detects a voltage developed across both ends of the battery 702. The current detection unit 706 detects a current that flows through the battery 702. The temperature detection unit 707 such as a thermistor, a thermocouple or the like detects the temperature of the battery 702. Analog signals corresponding to the detected voltage of the voltage detection unit 705 and the detected temperature of the temperature detection unit 707 are converted into digital signals by the first A/D converter 709. The detected analog current of the current detection unit 706 is converted into a digital signal by a second A/D converter 715, which is supplied via a bus to the operation unit 718 and the memory 719.

The temperature detection unit 707 may preferably be disposed in the neighborhood of the surface of the battery 702 and at a high-temperature heat storage portion near the central processing unit (CPU) 722 of the note PC 708. The protection circuit controller 716 executes control for securing the safety of the battery 702, such as protection of overcharge, protection of overdischarge, etc. in response to the values of the detected current, the detected voltage and the detected temperature and outputs a control command to the protection circuit 704. On the other hand, the operation unit 718 calculates a full charge capacity Qmax, an internal resistance R, a remaining capacity and the like using information about the detected current, voltage and temperature, and various information stored in the memory 719 and thereby executes the detection of a state of the battery 702. That is, since the result of calculation by the operation unit 718 is supplied to the central processing unit (CPU) 722 of the note PC 708 through the input/output unit 720, it is possible to display the remaining capacity of the battery, the remaining time available, etc. on the monitor of the note PC 708.

Figure 3:
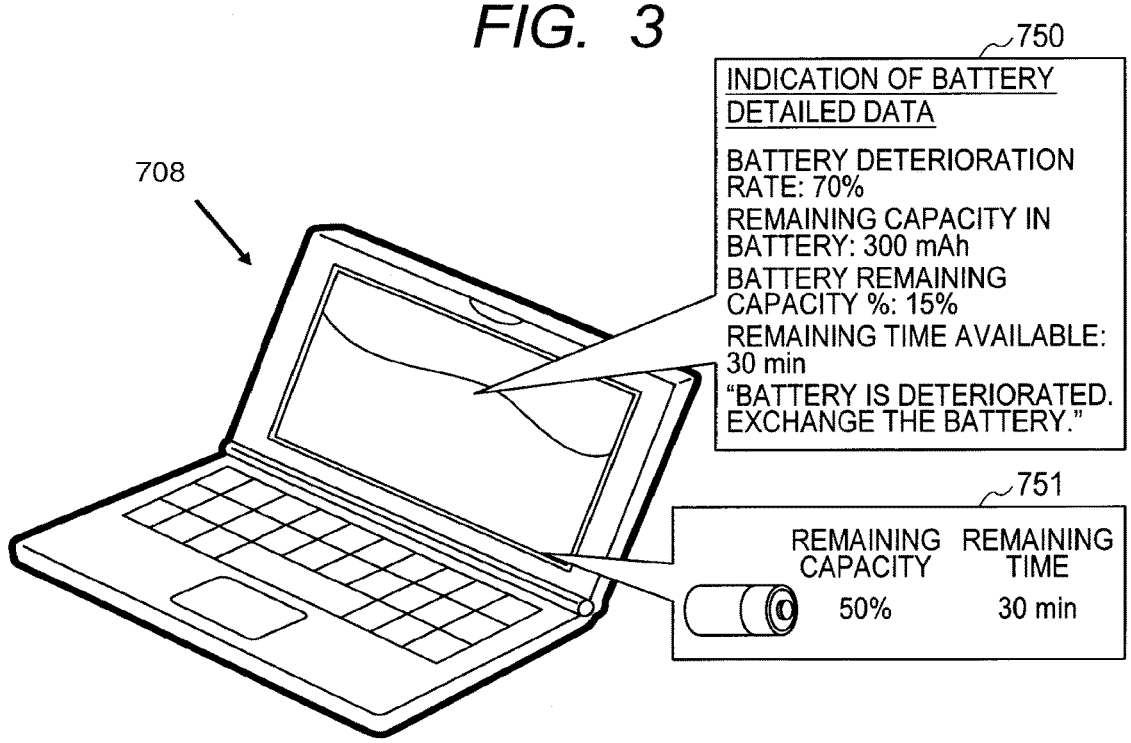
FIG. 3 is a diagram showing the manner in which information about the state of detection of a battery remaining capacity or the like is displayed on a monitor of a notebook personal computer 708 using the semiconductor integrated circuit 703 for battery control according to the first embodiment of the present invention shown in FIG. 1.

FIG. 3 is a diagram showing the manner in which information about the state of detection of a battery remaining capacity or the like is displayed on the monitor of the note PC 708 using the semiconductor integrated circuit 703 shown in FIG. 1.

For example, when the battery 702 is in use, the battery remaining capacity and the remaining time available are displayed in small font and/or symbols at the lower portion of the monitor as shown in a simplified display 751 of FIG. 3. Further, when a detailed display screen 750 is set up differently from above by the operation of the note PC 708, detailed information about a battery deterioration rate, a message for battery replacement, etc. for example are displayed. Incidentally, although the battery remaining capacity and the like are not illustrated in the drawing 751, they can be level-displayed using bars or the like implemented by a plurality of light emitting diodes (LEDs) disposed at the side face of the battery pack 701.

<<Function of Operation Unit>>

FIG. 4 is a diagram for describing the function of the operation unit 718 of the semiconductor integrated circuit 703 for battery control according to the first embodiment of the present invention shown in FIG. 1.

The function of calculating a full charge capacity Qmax by the function of the operation unit 718 is particularly shown in detail in FIG. 4. As shown in FIG. 4, the operation unit 718 is comprised of an adder 769, a Qmax-R deterioration coefficient operation part 768, an R temperature coefficient table 763, an internal resistance operation part 762, an internal resistance table 761, a voltage based charge-rate operation part 764, a current integrating part 765, a current based charge-rate operation part 766 and a comparison determination part 767. The respective functions of the Qmax-R deterioration coefficient operation part 768, the internal resistance operation part 762, the voltage based charge-rate operation part 764, the current integrating part 765, the current based charge-rate operation part 766 and the comparison determination part 767 in the operation unit 718 can actually be achieved by software processing of the central processing unit (CPU) that configure the operation unit 718. Further, the respective functions of the R temperature coefficient table 763, the internal resistance table 761 and the Qmax-R deterioration coefficient operation part 768 in the operation unit 718 can actually be achieved by the nonvolatile memory 719 such as the flash memory or the like for the operation unit 718.

As described at the outset, the full charge capacity Qmax indicates a capacity taken until a final discharging voltage is reached where discharge is done with a minimum current ($\approx 0$). The full charge capacity is generally calculated from a post-discharge end state of charge SOC, a pre-discharge start state of charge SOC_ini and a discharging current integrated value Quse like the following (equation 1):

$$Q\max = \frac{-\int Idt}{SOC - SOC\_ini} \qquad (1)$$
$$= \frac{-Q_{use}}{SOC - SOC\_ini}$$

where I indicates a discharging current of the battery 702, Quse indicates a discharging charge calculated by time integration of the discharging current from the battery 702, SOC indicates a charge amount or a state of charge after the discharge completion, and SOC_ini indicates a state of charge SOC immediately before the discharge, respectively. The state of charge SOC_ini taken immediately before the discharge herein may preferably use a recent voltage-based state of charge SOC_V in a state in which the voltage of the battery 702 after a predetermined time has elapsed after the end of charge and discharge is kept substantially stable. The voltage-based state of charge is stored in the nonvolatile memory or the volatile memory immediately before the start of charge and discharge and used therefrom.

A current-based state of charge SOC_I is generally calculated as shown below (equation 2).

$$SOC\_I = SOC\_ini - \frac{Q_{use}}{Q_{max}} * 100 \qquad (2)$$

SOC_ini, which is taken as the initial value of the current-based state of charge, is determined from the voltage developed immediately before the charge/discharge on a voltage basis, as determined by equation 3 below.

Figure 14:
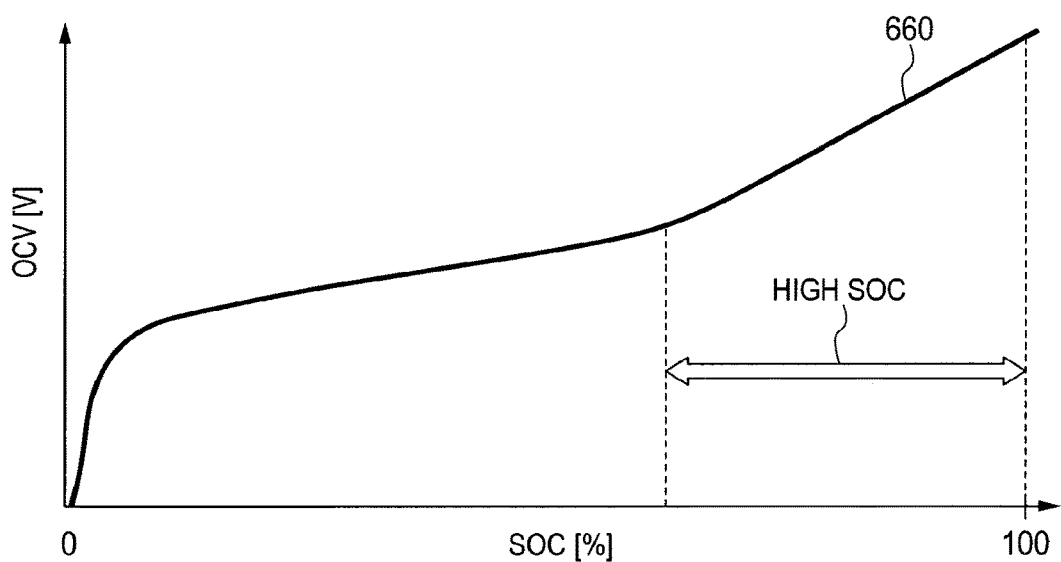
FIG. 14 is a diagram showing the relationship between a state of charge SOC of the battery 702 and an open-circuit voltage OCV of the battery 702.

On the other hand, the voltage-based state of charge can be calculated from an open-circuit voltage of the battery. Since a closed-circuit voltage CCV of the battery 702 is lower than an open-circuit voltage OCV of the battery 702 by a voltage drop developed between a discharging current I of the battery and its internal resistance R upon discharge of the battery 702, the voltage-based state of charge is given as the following (equation 3) from the relationship of CCV=OCV−IR.

$$SOC\_V = f(OCV) \qquad (3)$$
$$= f(CCV + IR)$$

where f indicates a function, OCV indicates an Open-Circuit Voltage, CCV is a Closed-Circuit Voltage, I is a discharging current of the battery 702, and R is an internal resistance of the battery 702, respectively. Incidentally, in order to calculate the function f(OCV), a relation table indicative of the relationship between a state of charge SOC and an open-circuit voltage OCV such as shown in FIG. 14 is provided separately in the nonvolatile memory for the operation unit 718.

On the other hand, the internal resistance R of the battery 702 is given by the following (equation 4):

$$R = f(SOC) * C_{Deg} * C_{Temp} \qquad (4)$$

where f indicates a function and is calculated by the relation table 761 indicative of the correspondence between the state of charge SOC and the internal resistance R of the battery 702. $C_{Deg}$ is a deterioration coefficient of the internal resistance R of the battery 702 and depends on the full charge capacity Qmax. $C_{Temp}$ is a temperature coefficient of the internal resistance R of the battery 702. That is, the above (equation 4) indicates that the value of the internal resistance R of the battery 702 depends on the state of charge SOC, the full charge capacity Qmax and the temperature.

Thus, in the operation unit 718 shown in FIG. 4, the initial value of the full charge capacity Qmax stored in its corresponding memory area of the nonvolatile memory for the memory 719 is supplied to the Qmax-R deterioration coefficient operation part 768 via the adder 769. The deterioration coefficient $C_{Deg}$ of the internal resistance R of the battery 702 is therefore outputted from the Qmax-R deterioration coefficient operation part 768.

On the other hand, since digital temperature information from the first A/D converter 709 about the detected temperature of the temperature detection unit 707 is supplied to the R temperature coefficient table 763 as temperature information Temp, the temperature coefficient $C_{Temp}$ of the internal resistance R of the battery 702 is outputted from the R temperature coefficient table 763.

On the other hand, since digital closed voltage information from the first A/D converter 709 about the closed-circuit voltage CCV of the battery 702, which is detected by the voltage detection unit 705, is supplied to the voltage based charge-rate operation part 764 as closed voltage information CCV, the voltage based charge-rate operation part 764 further calculates a voltage-based state of charge SOC_V in accordance with the above (equation 3) using the internal resistance R and the current value I and supplies the result of calculation to the internal resistance table 761. Thus, the internal resistance table 761 outputs the value of the function f(SOC) corresponding to the first term of the right side in the above (equation 4) in response to the voltage-based state of charge SOC_V.

As a result, the internal resistance operation part 762 is supplied with the deterioration coefficient $C_{Deg}$ of the internal resistance R of the battery 702, which is output from the Qmax-R deterioration coefficient operation part 768, the temperature coefficient $C_{Temp}$ of the internal resistance R of the battery 702, which is output from the R temperature coefficient table 763, and the function f(SOC) of the battery 702, which is output from the internal resistance table 761. Thus, the internal resistance operation part 762 calculates the internal resistance R of the battery 702 in accordance with the above (equation 4) using the function f (SOC), the deterioration coefficient $C_{Deg}$ and the temperature coefficient $C_{Temp}$.

On the other hand, digital current information from the second A/D converter 715 about the detected analog current of the current detection unit 706 is supplied to the voltage based charge-rate operation part 764 as current information I. Digital closed voltage information from the first A/D converter 709 about the closed-circuit voltage CCV of the battery 702, which is detected by the voltage detection unit 705, is supplied to the voltage based charge-rate operation part 764 as closed voltage information CCV. Thus, the voltage based charge-rate operation part 764 calculates a voltage-based state of charge SOC_V of the battery 702 subsequent to the start of discharge in accordance with the above (equation 3) using the internal resistance R of the battery 702 from the internal resistance operation part 762, the current information I from the second A/D converter 715, and the closed voltage information CCV from the first A/D converter 709.

On the other hand, the initial value SOC_ini of the current-based state of charge SOC_I calculated on a voltage basis from the open-circuit voltage OCV immediately before the start of discharge has been stored in the memory 719. The initial value SOC_ini of the current-based state of charge SOC_I read from the memory 719 is supplied to the current based charge-rate operation part 766. The initial value of the full charge capacity Qmax stored in the memory area of the nonvolatile memory for the memory 719 is supplied to the current based charge-rate operation part 766 through the adder 769. Further, the discharging current subsequent to the start of discharge of the battery 702 is supplied to the current integrating part 765 as the digital current information I from the second A/D converter 715 about the detected analog current of the current detection unit 706. Thus, the current integrating part 765 executes time integration of the discharging current and thereby calculates a discharging charge Quse subsequent to the start of discharge, of the battery 702. As a result, the current based charge-rate operation part 766 calculates a current-based state of charge SOC_I in accordance with the above (equation 2) using the initial value SOC_ini of the current-based state of charge SOC_I, the discharging charge Quse of the battery 702 and the initial value of the full charge capacity Qmax.

Ideally, the value of the voltage-based state of charge SOC_V of the battery 702 subsequent to the start of discharge thereof, which is calculated in accordance with the above (equation 3) by the voltage based charge-rate operation part 764, and the value of the current-based state of charge SOC_I of the battery 702 subsequent to the start of discharge thereof, which is calculated in accordance with the above (equation 2) by the current based charge-rate operation part 766, coincide with each other.

In fact, however, the value of the voltage-based state of charge SOC_V and the value of the current-based state of charge SOC_I often do not coincide with each other. As the cause of this non-coincidence or inconsistency, it is assumed that, for example, an error is contained in the internal resistance R of the battery 702 when the voltage-based state of charge SOC_V is calculated, i.e., an error in battery deterioration is contained in the function f(SOC) of the first term, in the deterioration coefficient $C_{Deg}$ of the second term or in the temperature coefficient $C_{Temp}$ of the third term in the right side of the above (equation 4) for determining the internal resistance R of the battery 702.

As another cause of this non-coincidence, it is assumed that the initial value of the full charge capacity Qmax stored in the memory area of the nonvolatile memory for the memory 719 differs from the actual full charge capacity Qmax of the battery 702 due to the degradation of the battery 702, for example.

Thus, particularly in the operation unit 718 shown in FIG. 4, of the semiconductor integrated circuit 703, the value of the voltage-based state of charge SOC_V calculated in accordance with the above (equation 3) by the voltage based charge-rate operation part 764, and the value of the current-based state of charge SOC_I calculated in accordance with the above (equation 2) by the current based charge-rate operation part 766 are respectively supplied to first and second input terminals of the comparison determination part 767. As a result, when the voltage-based state of charge SOC_V supplied to one input terminal is smaller than the value of the current-based state of charge SOC_I supplied to the other input terminal, the comparison determination part 767 outputs a comparison output signal ΔQmax, which is proportional to the difference between the two values or on which only the sign is reflected. That is, the comparison output signal ΔQmax is proportional to a value obtained by subtracting the value of the current-based state of charge SOC_I from the value of the voltage-based state of charge SOC_V. Thus, the comparison determination part 767 is configured by a digital subtractor, but can also be configured by a digital comparator. In either case, the two input signals are determined to have coincided with each other where the difference between the two input signals reaches a predetermined value or less. The comparison output signal ΔQmax generated from the comparison determination part 767 is added to the initial value of the full charge capacity Qmax by the adder 769 from which a corrected calculated value of the full charge capacity Qmax is generated.

<<Simulation Result>>

Figure 5:
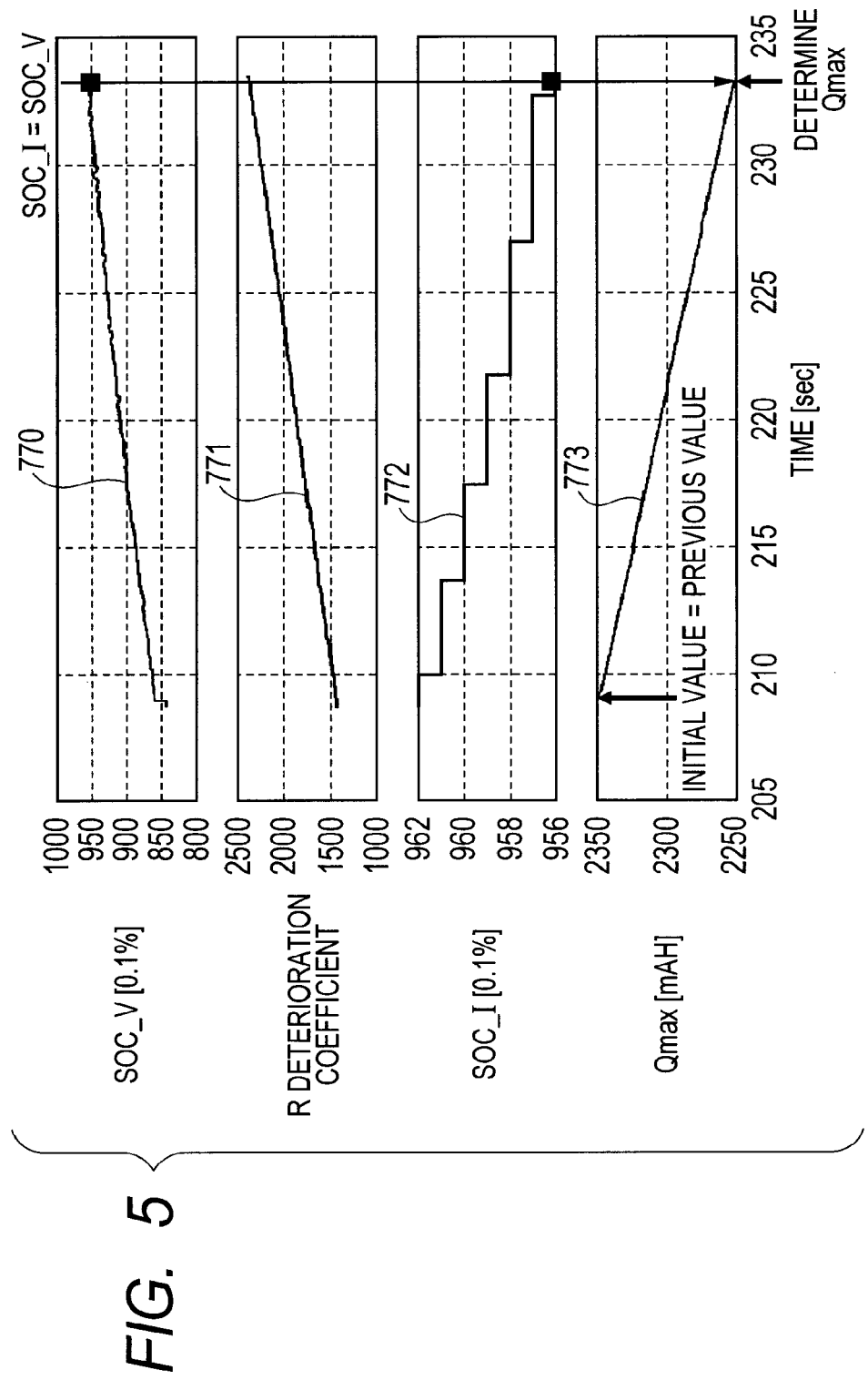
FIG. 5 is a diagram for describing an operation of the operation unit 718 shown in FIG. 4, of the semiconductor integrated circuit 703 for battery control according to the first embodiment of the present invention.

FIG. 5 is a diagram for describing an operation of the operation unit 718 of the semiconductor integrated circuit 703, which is shown in FIG. 4.

FIG. 5 shows the result of simulations using data about the open-circuit voltage OCV, the closed-circuit voltage CCV, the discharging current I, the temperature coefficient $C_{Temp}$ of the internal resistance R, the temperature of the battery pack 701, etc. at the usage of the battery pack 701 according to the first embodiment of the present invention shown in FIG. 1.

The value of the voltage-based state of charge SOC_V calculated by the voltage based charge-rate operation part 764, the value of the deterioration coefficient $C_{Deg}$ of the internal resistance R outputted from the Qmax-R deterioration coefficient operation part 768, and the value of the current-based state of charge SOC_I calculated by the current based charge-rate operation part 766, and the corrected calculated value of the full charge capacity Qmax generated by the adder 769 are shown in FIG. 5 in order.

In the simulations, since the value of the voltage-based state of charge SOC_V is smaller than the value of the current-based state of charge SOC_I, the value of the comparison output signal ΔQmax becomes a negative value. As a result, the corrected calculated value of the full charge capacity Qmax generated from the adder 769 is smaller than the stored initial value of the full charge capacity Qmax.

The corrected calculated value of the full charge capacity Qmax generated from the adder 769 is supplied to the Qmax-R deterioration coefficient operation part 768 and the current based charge-rate operation part 766. Since the corrected calculated value is smaller than the initial value, and Qmax is inversely related to the deterioration coefficient $C_{Deg}$ of the internal resistance R of the battery (see FIG. 6), the Qmax-R deterioration coefficient operation part 768 outputs a new value of $C_{Deg}$, which is larger than the previous value of $C_{Deg}$. As a result, the internal resistance operation part 762 calculates a new internal resistance R of the battery 702 again in accordance with the above (equation 4) using the function f(SOC), the temperature coefficient $C_{Temp}$ and the new deterioration coefficient $C_{Deg}$ having a value which is larger than the previous value. The recalculated value of the new internal resistance R of the battery 702 is larger than the previous value. Thus, the voltage based charge-rate operation part 764 calculates the voltage-based state of charge SOC_V of the battery 702 subsequent to the start of its discharge again in accordance with the above (equation 3) using the current information I from the second A/D converter 715, the closed voltage information CCV from the first A/D converter 709 and the new internal resistance R of the battery 702 which has been calculated by the internal resistance operation part 762. The value of the recalculated new voltage-based state of charge SOC_V is larger than the previous value in correspondence with the increase in the deterioration coefficient $C_{Deg}$ of the internal resistance R of the battery 702.

On the other hand, since the corrected calculated value of the full charge capacity Qmax generated from the adder 769 is supplied to the current based charge-rate operation part 766, the current based charge-rate operation part 766 calculates a new current-based state of charge SOC_I in accordance with the above (equation 2) using the initial value SOC_ini of the current-based state of charge SOC_I, the discharging charge Quse of the battery 702, and the corrected calculated value of the full charge capacity Qmax. Since the corrected calculated value of the full charge capacity Qmax is smaller than the initial value of the full charge capacity Qmax, the value of the current-based state of charge SOC_I calculated again in accordance with the above (equation 2) is smaller than the previous value.

Thus, the new value of the voltage-based state of charge SOC_V calculated by the voltage based charge-rate operation part 764 increases, whereas the new value of the current-based state of charge SOC_I calculated by the current based charge-rate operation part 766 decreases. Accordingly, the value of the voltage-based state of charge SOC_V and the value of the current-based state of charge SOC_I which had not coincided with each other at the beginning, coincide with each other.

Accordingly, the ideal state that the value of the voltage-based state of charge SOC_V and the value of the current-based state of charge SOC_I coincide with each other is realized by the operation unit 718 of the semiconductor integrated circuit 703, which is shown in FIG. 4. In the ideal state, the values of the full charge capacity Qmax and the internal resistance R each including the error that has become the cause of non-coincidence between the value of the voltage-based state of charge SOC_V and the value of the current-based state of charge SOC_I are calculated without substantially including any error. Accordingly, the accurate remaining capacity of the battery 702 can be calculated by accurately calculating such two important parameters.

Although the values of the full charge capacity Qmax and the internal resistance R are calculated using the value of the voltage-based state of charge SOC_V and the value of the current-based state of charge SOC_I, both of which change sequentially during the discharge of the battery 702, current and voltage values in a time domain in which the discharging current of the battery 702 is kept stable may be stored in the volatile memory for the memory 719 and thereby calculated on the basis of data at a certain timing.

The above description assumes that the simultaneous equations of the above (equation 2), the above (equation 3), the above (equation 4) and "the relational expression of the full charge capacity Qmax and the internal resistance deterioration coefficient" apply in an ideal state "SOC_I=SOC_V", and calculates the value of the current-based state of charge SOC_I, the value of the voltage-based state of charge SOC_V, the value of the full charge capacity Qmax and the value of the internal resistance deterioration coefficient of the internal resistance R, which are unknown variables.

In the above description, there has been adopted the method of sequentially changing the value of the full charge capacity Qmax to thereby calculate the value of the current-based state of charge SOC_I, the value of the voltage-based state of charge SOC_V, the corrected calculated value of the full charge capacity Qmax and the value of the internal resistance deterioration coefficient of the internal resistance R. The internal resistance deterioration coefficient of the internal resistance R may sequentially be changed or a bisection method or the like can also be adopted.

After calculating the corrected calculated value of the full charge capacity Qmax and the internal resistance R described above, the state of charge SOC to be taken during the discharge is sequentially calculated by the operation unit 718 in accordance with the following (equation 5):

$$SOC = SOC\_ini - \frac{Q_{use}}{Q_{max}} * 100 \qquad (5)$$

Prior to the calculation of the above (equation 5), the operation unit 718 reads the initial value SOC_ini of the current-based state of charge SOC_I and the full charge capacity Qmax, both of which have been stored in the memory 719, and calculates the state of charge SOC in accordance with the above (equation 5) using the current integrated value (i.e., the amount of charge discharged Quse). As a result, the central processing unit (CPU) 722 of the note PC 708 calculates a charge rate RSOC, a remaining time and a remaining capacity actually available, which are based on a smart battery system, using the calculated state of charge SOC and full charge capacity Qmax and the internal resistance R and display them on the monitor.

<<Operation of Operation Unit>>

Figure 8:
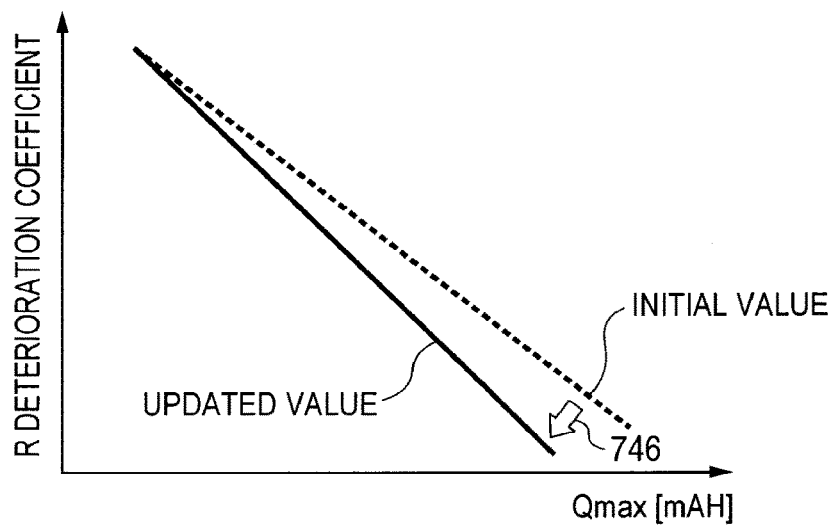
FIG. 8 is a diagram for describing another preferred operation of the operation unit 718 shown in FIG. 4, of the semiconductor integrated circuit 703 for battery control according to the first embodiment of the present invention.

FIGS. 6, 7 and 8 are respectively diagrams for describing operations of the operation unit 718 of the semiconductor integrated circuit 703, which is shown in FIG. 4.

The calculation of the full charge capacity Qmax and the internal resistance R or the like during the discharge is carried out by three Steps: a process A taken immediately after the start of discharge, which is shown in FIG. 6, a process B during the discharge, which is shown in FIG. 7, and a process C after the end of discharge, which is shown in FIG. 8.

<<Process Immediately after the Start of Discharge>>

FIG. 6 shows the process A of the operation unit 718 immediately after the start of discharge of the battery 702.

Since a linear or curvilinear correlation exists between the full charge capacity Qmax and the internal resistance deterioration coefficient Cdeg, both of which are affected by deterioration of the battery 702, this correlation is stored in the nonvolatile memory in the form of an approximate expression or a look-up table. As described above, the value of the current-based state of charge SOC_I and the value of the voltage-based state of charge SOC_V are respectively calculated using the full charge capacity Qmax and the internal resistance deterioration coefficient $C_{deg}$. Since the ideal state is taken as "SOC_I=SOC_V", it is possible to estimate the state of deterioration of the battery. Since both the full charge capacity Qmax and the internal resistance R change every moment depending on the deterioration and are unknown, the value of the full charge capacity Qmax and the value of the internal resistance deterioration coefficient Cdeg at the point where the value of the current-based state of charge SOC_I and the value of the voltage-based state of charge SOC_V coincide with each other as shown in FIG. 6 using the above calculation method, are respectively taken to be correct values therefor.

That is, at the first Step A1 of FIG. 6, the initial value of the full charge capacity Qmax stored in the memory area of the nonvolatile memory for the memory 719 is supplied to the Qmax-R deterioration coefficient operation part 768 via the adder 769 (since ΔQmax is initially 0). The deterioration coefficient $C_{Deg}$ of the internal resistance R of the battery 702 is therefore outputted from the Qmax-R deterioration coefficient operation part 768.

At the next Step A2 of FIG. 6, the comparison determination part 767 feedback-controls a corrected calculated value of the full charge capacity Qmax in such a manner that the value of the voltage-based state of charge SOC_V subsequent to the start of discharge, which is calculated by the voltage based charge-rate operation part 764, and the value of the current-based state of charge SOC_I subsequent to the start of discharge, which is calculated by the current based charge-rate operation part 766, coincide with each other. Since the value of the deterioration coefficient $C_{Deg}$ of the internal resistance R changes during the control of the corrected calculated value of the full charge capacity Qmax at Step A2, the value of the voltage-based state of charge SOC_V and the value of the current-based state of charge SOC_I coincide with each other while the process at Step A2 and the process at Step A1 are being repeated. The corrected calculated value of the full charge capacity Qmax at this coincidence timing is used for the correct display of remaining capacity of the battery 702. At Step A2, the initial value of the full charge capacity Qmax and the initial value SOC_ini of the current-based state of charge SOC_I both stored in the nonvolatile memory for the memory 719 are respectively updated by the state of charge SOC that has coincided with the corrected calculated value of the full charge capacity Qmax.

<<Process During the Discharge>>

FIG. 7 is a diagram for describing a preferred operation of the operation unit 718 shown in FIG. 4, of the semiconductor integrated circuit 703.

FIG. 7 shows the process B of the operation unit 718 during the discharge of the battery 702.

During the discharge, a charge rate RSOC, a remaining time and a remaining capacity available actually are sequentially calculated on the basis of the full charge capacity Qmax and the internal resistance R calculated at the process A of FIG. 6. The internal resistance table 761 important for the calculation of these remaining capacities is updated during the discharge. This is because the value of the internal resistance of the battery 702 is used for the calculation of remaining capacities and important even for the calculation of a discharge end state of charge SOC_fin, and the internal resistance of the battery 702 changes due to its deterioration.

FIG. 7 shows the manner in which during the continuation of discharge of the battery 702 subsequent to the start of its discharge, the content of the internal resistance table 761 which outputs the value of the function f(SOC) of the first term in the right side of the above (equation 4) is updated in response to the voltage-based state of charge SOC_V.

Since the closed-circuit voltage CCV of the battery 702 is lower than the open-circuit voltage OCV by a voltage drop developed by the discharging current I and internal resistance R of the battery during the discharge of the battery 702 as mentioned above, the relationship of CCV=OCV−IR is established.

Thus, even when the SOC characteristic of the internal resistance R changes due to cycle deterioration or storage deterioration of the battery 702, the value of the internal resistance R taken during the discharge can be calculated in accordance with the following (equation 6) using the closed-circuit voltage CCV detected by the voltage detection unit 705 and the discharging current I detected by the current detection unit 706. The open voltage information OCV is calculated from the current-based state of charge SOC_I using the relationship between the state of charge SOC of the battery 702 and the open-circuit voltage OCV of the battery 702, which relationship is stored in the memory and exemplified by in FIG. 14.

$$R = \frac{OCV - CCV}{I} \quad (6)$$

At that time, the operation unit 718 outputs the value of the function f(SOC) of the first term in the right side of the above (equation 4) related to each state of charge SOC using the deterioration coefficient $C_{Deg}$ of the internal resistance R outputted from the Qmax-R deterioration coefficient operation part 768 and the temperature coefficient $C_{Temp}$ of the internal resistance R outputted from the R temperature coefficient table 763.

The value of the function f(SOC) corresponding to each of the values of the states of charge SOC is stored in the internal resistance table 761. Therefore, when the value of the function f(SOC) outputted from the operation unit 718 in correspondence with a given state of charge SOC is different from the value calculated in the past and stored in the internal resistance table 761, the internal resistance table 761 is updated based on a new calculated value of the function f(SOC) as shown by arrow 744 of FIG. 7. Thus, even though the deterioration of the battery 702 progresses and the characteristic of the internal resistance R of the battery 702 with respect to each state of charge SOC changes, the value of the function f(SOC) stored in the internal resistance table 761 can be updated to the latest state.

Further, the internal resistance table 761 can also be updated by estimating the value of the function f(SOC) corresponding to each state of charge SOC not greater than a given state of charge SOC in accordance with the value of the function f(SOC) corresponding to the given state of charge SOC as indicated by arrow 745 of FIG. 7. This estimation is done by multiplying a pre-update value by the same rate of change as the rate of change in the value of the function f(SOC) corresponding to the given state of charge SOC to thereby calculate a post-update value.

During the discharge, the internal resistance table 761 is updated at a 10% change step of the state of charge SOC in the embodiment shown in FIG. 7. When the deterioration of the battery 702 is however large as viewed from the time of previous usage, the internal resistance taken immediately before the end of discharge greatly changes and the accuracy of calculation of a discharge-end state of charge SOC being a parameter important for the estimation of a remaining capacity is degraded. It is therefore recommended that the frequency of updating of the internal resistance is increased immediately before the discharge end.

<<Process after the End of Discharge>>

FIG. 8 is a diagram for describing another preferred operation of the operation unit 718 shown in FIG. 4, of the semiconductor integrated circuit 703 for battery control according to the first embodiment of the present invention.

FIG. 8 shows the process C of the operation unit 718 at the time that a few hours have elapsed after the discharge of the battery 702 has been ended.

The process C of FIG. 8 after the end of battery discharge is used to update the correlation between the full charge capacity Qmax and the internal resistance deterioration coefficient Cdeg to be used for the next process A taken immediately after the discharge start shown in FIG. 6. Thus, the accuracy of calculation of the full charge capacity Qmax and the internal resistance deterioration coefficient Cdeg can be improved in the next process taken immediately after the start of the discharge.

After the end of the discharge, the correct full charge capacity Qmax is calculated from the above (equation 1) using the voltage-based state of charge SOC_V and the integrated charge quantity Quse taken during the discharge, and the internal resistance deterioration coefficient Cdeg is also recalculated. Thus, the correct relation between the full charge capacity Qmax and the internal resistance deterioration coefficient Cdeg, both obtained each time the discharge is ended, is calculated by an approximate expression using the method of least squares, for example, followed by being updated.

As is well known, the battery 702 gradually increases in voltage by being affected by a resistance large in time constant after the end of its discharge, and the voltage thereof is stabilized after a few hours. The so-stabilized voltage is an open-circuit voltage OCV.

When two hours or so have elapsed after the end of discharge of the battery 702, the operation unit 718 is capable of calculating the full charge capacity Qmax in accordance with the above (equation 1) using the pre-discharge start state of charge SOC_ini, the discharging current integrated value Quse, and the state of charge SOC calculated from the open-circuit voltage OCV of the battery 702 detected by the voltage detection unit 705. The operation unit 718 also calculates the internal resistance deterioration coefficient Cdeg from the voltage and current information at a predetermined time during the discharge. The operation unit 718 calculates the relation between the so-obtained internal resistance deterioration coefficient Cdeg and the full charge capacity with reference to a plurality of times of data at the discharge prior to the above in accordance with, for example, the approximate expression using the method of least squares, and updates the same, followed by being stored into the nonvolatile memory.

The updating of the operation method of the Qmax-R deterioration coefficient operation part 768, which is indicated by arrow 746 of FIG. 8 can be achieved by rewriting the nonvolatile memory for the memory 719 having stored therein the software of the central processing unit (CPU) that configures the operation unit 718. That is, the software of the central processing unit (CPU) is reprogrammed by rewriting of the nonvolatile memory, and the approximation expression of the Qmax-R deterioration coefficient operation part 768 is renewed.

As described above, the approximation expression of the Qmax-R deterioration coefficient operation part 768 of the operation unit 718, which has been updated by the process C of the operation unit 718 when the few hours have elapsed after the end of discharge of the battery 707 as shown in FIG. 8 is used in the first Step A1 of the process A of the operation unit 718 immediately after the start of discharge of the battery 702, which is shown in FIG. 6.

Updating the approximation expression of the full charge capacity Qmax and the internal resistance deterioration coefficient by the process C after the end of discharge in FIG. 8 as described above enables an improvement in the accuracy of calculation of the full charge capacity Qmax and the internal resistance deterioration coefficient Cdeg at the next process A taken immediately after the start of discharge shown in FIG. 6. This is because particularly in the case where the quiescent time of electronic equipment becomes long and the battery 702 is drastically deteriorated till the next discharge, the full charge capacity Qmax and the internal resistance deterioration coefficient Cdeg on which deterioration is reflected can be calculated by the process C taken after the end of discharge in FIG. 8 and the next process A taken immediately after the start of discharge in FIG. 6, thus making it possible to display more accurate remaining capacity.

The internal resistance deterioration coefficient Cdeg of the battery 702 has been used in the first embodiment. When the deterioration coefficient is however not used, the relational expression between the full charge capacity Qmax and the internal resistance of the battery 702 can also be used in the process A taken immediately after the start of discharge in FIG. 6.

Second Embodiment

The semiconductor integrated circuit 703 for battery control shown in FIG. 1 is capable of controlling not only the discharge operation of the battery 702 but also the charge operation thereof, as described in the first embodiment.

The battery 702 can deteriorate due to charge-discharge cycle deterioration, storage deterioration, or the like. The battery 702 can also be drastically deteriorated upon the start of its charge. The semiconductor integrated circuit 703 shown in FIG. 1 is configured so as to carry out the overcharge protection operation and the overcurrent protection operation during the charge operation. On the other hand, the remaining charge time may preferably be displayed during the charge operation. In order to allow the operation unit 718 to calculate the accurate charging time, however, the operation unit 718 needs to calculate the correct full charge capacity Qmax and internal resistance of the battery 702 being charged.

Thus, during the charge operation of the battery 702, the semiconductor integrated circuit 703 shown in FIG. 1 can also execute a process immediately after the start of charge, similar to the process A taken immediately after the start of discharge described in FIG. 6.

That is, at the Step A1 of the process taken immediately after the start of charge, the initial value of the full charge capacity Qmax stored in the memory area of the nonvolatile memory for the memory 719 is supplied to the Qmax-R deterioration coefficient operation part 768 via the adder 769 (again with ΔQmax=0). Therefore, the deterioration coefficient $C_{Deg}$ of the internal resistance R of the battery 702 is outputted from the Qmax-R deterioration coefficient operation part 768.

Since there is a case where the charge and discharge of the battery 702 are different in internal resistance value, there is a need to multiply the equation for calculation of an internal resistance at its discharge by a charge correction coefficient stored separately in the nonvolatile memory for the memory 719 upon the calculation of the internal resistance of the battery 702 at its charge.

At the next Step A2 of the process taken immediately after the start of charge, the comparison determination part 767 feedback-controls a corrected calculated value of the full charge capacity Qmax in such a manner that the value of a voltage-based state of charge SOC_V subsequent to the start of charge, which is calculated by the voltage based charge-rate operation part 764, and the value of a current-based state of charge SOC_I subsequent to the start of charge, which is calculated by the current based charge-rate operation part 766, coincide with each other. The current integrating part 765 however calculates a charging charge Qcharge of the battery 702 corresponding to the time integration of a charging current. Since the value of the deterioration coefficient $C_{Deg}$ of the internal resistance R varies during the control of the corrected calculated value of the full charge capacity Qmax at this Step A2, the value of voltage-based state of charge SOC_V and the value of the current-based state of charge SOC_I coincide with each other while the process at Step A2 and the process at Step A1 are being repeated. The corrected calculated value of the full charge capacity Qmax at this coincidence timing is used for the calculation of the accurate remaining charge time of the battery 702.

During the charge, the operation unit 718 calculates the remaining charge time of the battery 702 using the value of the calculated full charge capacity Qmax. A concrete method for calculating the remaining charge time of the battery 702 will be described in detail later.

Further, during the period of the charge operation of the battery 702, the semiconductor integrated circuit 703 shown in FIG. 1 can also carry out a process to estimate the charge duration, which is similar to the process B to estimate the discharge duration (remaining capacity) described in FIG. 7.

That is, the content of the internal resistance table 761 that outputs the value of the function f(SOC) of the first term in the right side of the above (equation 4) is updated by the process to estimate the charge duration in response to the voltage-based state of charge SOC_V. Since the closed-circuit voltage CCV of the battery 702 is higher than the open-circuit voltage OCV of the battery 702 by a voltage drop developed between the discharging current I of the battery and its internal resistance R upon charge of the battery 702, the relation of CCV=OCV+IR is established. Thus, the operation unit 718 calculates the internal resistance of the battery 702 using this relation. Since the process in the charge duration is identical to the process B in the discharge duration described in FIG. 7 in other respects, their description will be omitted.

Furthermore, when a few hours have elapsed after the end of charge of the battery 702, the semiconductor integrated circuit 703 shown in FIG. 1 can also execute a process at the time when a few hours have elapsed after the end of charge, which is similar to the process C at the time when the few hours have elapsed after the end of discharge described in FIG. 8. Since the process being processed at the time when the few hours have elapsed after the end of charge is identical in other respects to the process C at the time when the few hours have elapsed after the end of discharge described in FIG. 8, their description will be omitted.

The calculation of the full charge capacity Qmax and the updating process of the internal resistance described above need not necessarily be executed during the charge. This is because the value of the full charge capacity Qmax and the value of the internal resistance can be corrected upon the process of calculation of the remaining charge time.

<<Calculation of Remaining Charge Time>>

Figure 10:
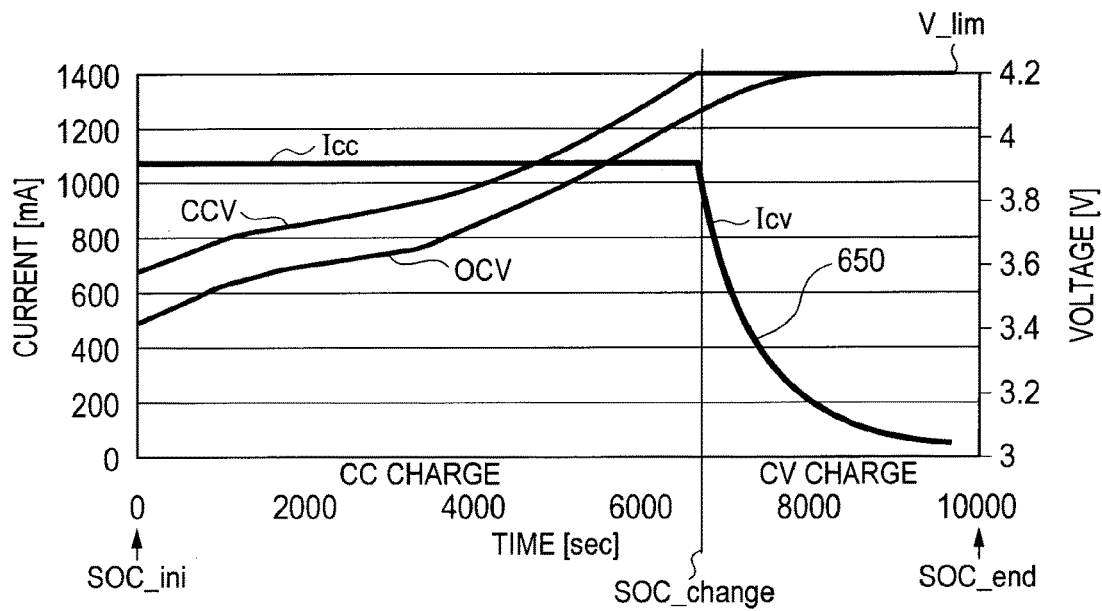
FIG. 10 is a diagram illustrating the manner in which a battery 702 is charged using the semiconductor integrated circuit 703 for battery control shown in FIG. 1.

FIG. 10 is a diagram showing the manner in which the battery 702 is charged using the semiconductor integrated circuit 703 shown in FIG. 1.

That is, the battery 702 is capable of being charged from the AC power supply 731 through the AC/DC converter 712, the DC/DC converter 721 and the protection circuit 704 using the semiconductor integrated circuit 703 shown in FIG. 1. When the battery 702 is a lithium ion battery, the charging of a constant current/constant voltage is generally often used.

During the initial first stage of charge as shown in FIG. 10, the battery 702 is charged by a constant current Icc until the closed-circuit voltage CCV of the battery 702 reaches a predetermined limit voltage V_lim, and the battery reaches a first charge amount, called a constant current charge (CC charge). Thereafter, during a subsequent second stage of charge as shown in FIG. 10, the battery 702 is further charged at the limit voltage V_lim, which is a constant voltage, and takes on an additional second charge, called a constant voltage charge (CV charge). During the period of the constant voltage charge (CV charge) at the subsequent stage of charge, the value of a variable charging current Icv based on the constant voltage charge (CV charge) decreases gradually. The state of full charge is reached when the value of the variable charging current Icv has reached a predetermined prescribed minimum current I_lim.

A state of charge SOC calculated by the open-circuit voltage OCV immediately before the charge of the battery 702 is started is assumed to be a charge initial-value state of charge SOC_ini. A state of charge SOC in the fully charged state is assumed to be a fully-charged state of charge SOC_end. A state of charge SOC at the time the charge operation of the battery 702 changes from the constant current charge (CC charge) to the constant voltage charge (CV charge) is taken as a change-point state of charge SOC_change.

FIG. 12 is a diagram showing a flowchart for calculating the remaining charge time of the battery 702 using the semiconductor integrated circuit 703 shown in FIG. 1. The premise is that calculating the remaining charge time of the battery 702 may be carried out immediately after the start of charge using either the corrected calculated value of the full charge capacity Qmax if it has already been calculated by executing Steps A1 and A2 of the process A taken immediately after the start of discharge shown in FIG. 6, or the full charge capacity Qmax at the previous discharge.

At Step 601 of FIG. 12, the operation unit 718 calculates the change-point state of charge SOC_change in the following manner.

That is, since the closed-circuit voltage CCV of the battery 702 is higher than the open-circuit voltage OCV of the battery 702 by a voltage drop developed by a discharging current I and an internal resistance R of the battery during the charge of the battery 702, the relationship of CCV=OCV+IR is established.

Since the relationship of CCV=V_lim is established during the period of the constant voltage charge (CV charge), the value of the charging current Icv for the constant voltage charge (CV charge) is calculated by the operation unit 718 in accordance with the following (equation 7).

$$I_{cv} = \frac{CCV - OCV}{R} = \frac{V_{\_lim}}{R} - OCV \quad (7)$$

That is, the value of a limit voltage V_lim, which is a constant voltage used in the constant voltage charge (CV charge), is stored in the memory 719. Further, the value of the internal resistance R of the battery 702 is determined by the above (equation 6) in a manner similar to the time of discharge, using the current closed-circuit voltage CCV detected by the voltage detection unit 705 and the current charging current I detected by the current detection unit 706, as explained above with respect to the equation 6. When there is a need to perform a charge correction, the value of the internal resistance R is calculated by multiplying the value by an internal resistance charge coefficient and stored in the memory 719. Further, the open-circuit voltage OCV is calculated from the state of charge SOC using the relationship between the state of charge SOC and the open-circuit voltage OCV, which relationship is exemplified by FIG. 14 and stored in the memory 719. As a result, the operation unit 718 reads necessary information from the memory 719, thereby enabling the calculation of the charging current Icv at the constant voltage charge (CV charge) in accordance with the above (equation 7).

Next, the operation unit 718 calculates the change-point state of charge SOC_change, which is the point where the charging current Icv for the constant voltage charge calculated by the above (equation 7) coincides with the constant current Icc for the constant current charge. The values of the charging current Icv calculated by the above (equation 7) and the limit voltage V_lim read from the memory 719, and the value of the internal resistance R of the battery 702 are supplied to the voltage based charge-rate operation part 764 of the operation unit 718, so that the change-point state of charge SOC_change can be outputted from the voltage based charge-rate operation part 764.

On the other hand, there is another method by focusing on the period of the constant current charge (CC charge). The closed-circuit voltage CCV of the battery 702 at each state of charge SOC is calculated from the open-circuit voltage OCV and the internal resistance. The state of charge SOC becomes a change-point state of charge SOC_change when the closed-circuit voltage CCV coincides with the limit voltage V_lim. The relation of CCV=OCV+Icc·R=V_lim, and I=Icc is established at this coincidence timing. The charging current Icc for the constant current charge (CC charge), the limit voltage V_lim for the constant current charge (CC charge) read from the nonvolatile memory for the memory 719, and the value of the internal resistance R of the battery 702 are supplied to the voltage based charge-rate operation part 764 of the operation unit 718, which then outputs the change-point state of charge SOC_change. Incidentally, the value of the charging current Icc for the constant current charge (CC charge) may be stored in the memory area of the nonvolatile memory for the memory 719 in advance. Alternatively, the digital current information from the second A/D converter 715 representing the detected analog current of the current detection unit 706 can also be utilized.

Next, at Step 602 of FIG. 12, the operation unit 718 calculates a charge period Tcc for the constant current charge (CC charge) in the following manner by using the change-point state of charge SOC_change calculated by the Step 601.

The full charge capacity Qmax related to the charge operation of the battery 702 is given like the following (equation 8):

$$Q_{max} = \frac{\int I_{cc} dt}{SOC\_ini - SOC\_change} = \frac{I_{cc} * T_{cc}}{SOC\_ini - SOC\_change} \quad (8)$$

where Icc is a charging current for the constant current charge (CC charge) of the battery 702, SOC_ini is an initial value of a state of charge SOC immediately before the charge, Tcc is a charge period for the constant current charge (CC charge) which is to be calculated, and SOC_change is a change-point state of charge SOC with the timing at which the charge operation of the battery 702 changes from the constant current charge (CC charge) to the constant voltage charge (CC charge).

Thus, the charge period Tcc of the constant current charge (CC charge) is calculated from the above (equation 8) as shown below (equation 9):

$$T_{cc} = \frac{Q_{max} * (SOC\_ini - SOC\_change)}{I_{cc}} \quad (9)$$

That is, the operation unit 718 reads the full charge capacity Qmax, and the state-of-charge initial value SOC_ini, the change-point state of charge SOC_change and the charging current Icc for the constant current charge (CC charge) taken immediately before the discharge to thereby calculate the charge period Tcc for the constant current charge (CC charge) in accordance with the above (equation 9).

Next, at Step 603 of FIG. 12, the operation unit 718 calculates a charge period Tcv for the constant voltage charge (CV charge) in the following manner using the change-point state of charge SOC_change calculated by the above Step 601. The calculation of the charge period Tcv for the constant voltage charge (CV charge) by the following (equation 10) is performed by calculating and integrating a part charge period Tcv necessary to increase the state of charge SOC by 0.1% in accordance with an analogy from the above (equation 9).

$$T_{cv} = \int_{SOC\_change}^{SOC\_end} \frac{(Q_{max}/1000)}{I_{cv}} d(soc) \quad (10)$$

That is, the operation unit 718 reads the full charge capacity Qmax and the change-point state of charge SOC_change stored in advance in the memory area of the nonvolatile memory for the memory 719 at Step 603 of FIG. 12 and calculates the charge period Tcv for the constant voltage charge (CV charge) in accordance with the above (equation 10), based on the charging current Icv for the constant voltage charge (CV charge) calculated in accordance with the above (equation 7). Incidentally, since the fully-charged state of charge SOC_end does not necessarily reach 100% due to the deterioration of the battery 702 at this time, it is calculated separately by the operation unit 718.

In particular, a linear approximation method to be described below is used for the calculation of the charge period Tcv for the constant voltage charge (CV charge) according to the above (equation 10).

Figure 9:
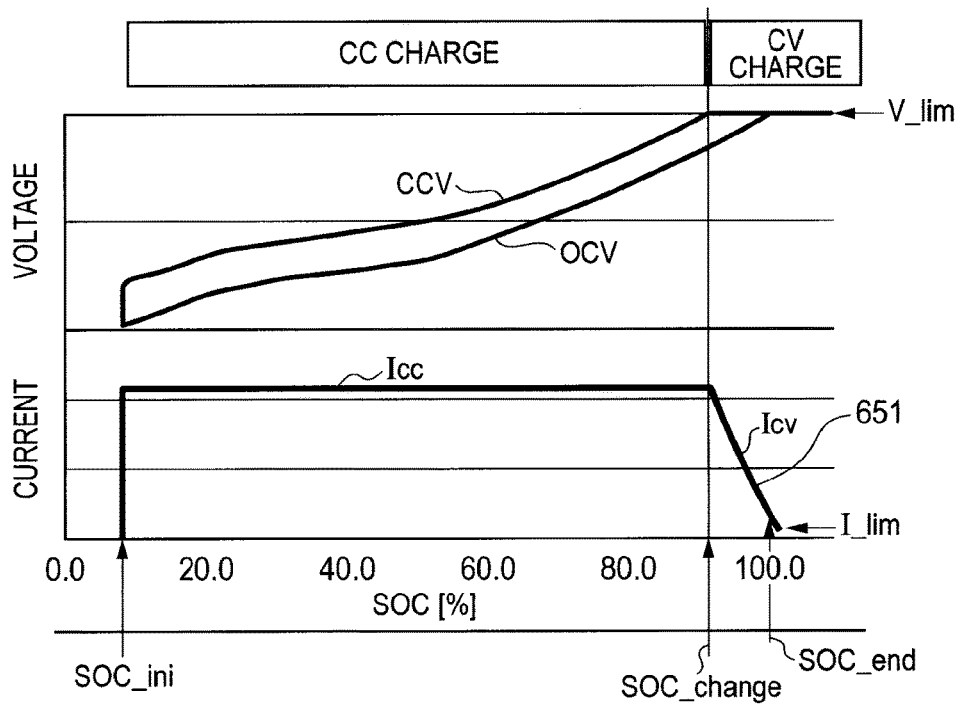
FIG. 9 is a diagram showing the manner in which a linear approximation method is utilized when a charging time Tcv for constant voltage charge (CV charge) is calculated using the semiconductor integrated circuit 703 for battery control shown in FIG. 1.

FIG. 9 is a diagram showing the manner in which the linear approximation method is utilized when the charge period Tcv for the constant voltage charge (CV charge) is calculated using the semiconductor integrated circuit 703 shown in FIG. 1.

Strictly speaking, the charging current Icv for the constant voltage charge (CV charge) exponentially decreases with respect to a change in time as shown in a curved line 650 of FIG. 10. The charging current Icv for the constant voltage charge (CV charge) however decreases approximately linearly with respect to a change in the state of charge SOC as shown in a straight line 651 of FIG. 9. Further, the constant voltage charge (CV charge) is carried out in an area in which the state of charge SOC at the latter half of the charge period of the battery 702 is high. Furthermore, in the above (equation 7) for determining the value of the charging current Icv for the constant voltage charge (CV charge), the charging voltage V_lim being the closed-circuit voltage CCV of the battery 702 is a constant voltage, and the internal resistance R can also be assumed to be a constant value without a large change in an area in which the state of charge SOC is high.

On the other hand, FIG. 14 is a diagram showing the relationship between the state of charge SOC of the battery 702 and the open-circuit voltage OCV of the battery 702.

As shown in a characteristic 660 of FIG. 14, the open-circuit voltage OCV and the state of charge SOC are placed in a substantially linear type correlation in an area in which the state of charge SOC is high.

Thus, in the above (equation 7), the open-circuit voltage OCV is used to predict the value of the charging current Icv for the constant voltage charge (CV charge) by using the relation in which the open-circuit voltage OCV is approximately linear with the state of charge SOC.

FIG. 11 is a diagram for describing in further detail the linear approximation method used when the charging time Tcv for the constant voltage charge (CV charge) shown in FIG. 9 is calculated.

As shown in FIG. 11, the operation unit 718 calculates the gradient 'a' of a approximate straight line shown in FIG. 11 from the value of the constant current Icc used in the constant current charge (CC charge), the value of a prescribed current I_lim of the charging current Icv for determining the attainment of a fully charged state, the change-point state of charge SOC_change calculated at Step 601 of FIG. 12, and the fully-charged state of charge SOC_end like the following (equation 11).

$$a = \frac{I_{cc} - I\_lim}{SOC\_end - SOC\_change} \quad (11)$$

Thus, the operation unit 718 calculates the value of the charging current Icv for the constant voltage charge (CV charge) like the following (equation 12) using the gradient a calculated like the above (equation 11), based on the current-based state of charge SOC_I momentarily calculated by the current based charge-rate operation part 766 according to the approximate straight line shown in FIG. 11.

$$I_{cv} = I\_lim + a*(SOC\_end - SOC\_I) \quad (12)$$

Accordingly, the value of the charging current Icv for the constant voltage charge (CV charge) calculated by the above (equation 12) is used for the calculation of the charging time Tcv for the constant voltage charge (CV charge) of the above (equation 10), thereby making it possible to calculate the charging time Tcv from the change-point state of charge SOC_change to the fully-charged state of charge SOC_end.

Next, at Step 604 of FIG. 12, the operation unit 718 adds the charging time Tcc for the constant current charge (CC charge) calculated at Step 602 of FIG. 12 and the charging time Tcv for the constant voltage charge (CV charge) calculated at Step 603 of FIG. 12 like the following (equation 13), thereby calculating a remaining charge time Tcg.

$$T_{cg} = T_{cc} + T_{cv} \quad (13)$$

Thus, the remaining charge time Tcg calculated by the operation unit 718 at Step 604 of FIG. 12 can be shown in a simplified display 751 or on a detailed display screen 750 like the monitor display of FIG. 3 during the charge of the battery 702.

Next, at Step 605 of FIG. 12, the change-point state of charge SOC_change is calculated for when the closed-circuit voltage CCV of the battery 702 actually coincides with the limit voltage V_lim.

This means that either one of the value of the voltage-based state of charge SOC_V outputted from the voltage based charge-rate operation part 764 and the value of the current-based state of charge SOC_I outputted from the current-based charge-rate operation part 766 is calculated as the change-point state of charge SOC_change when the closed-circuit voltage CCV of the battery 702 (which is the detected voltage of the voltage detection unit 705) coincides with the limit voltage V_lim.

The value of the change-point state of charge SOC_change calculated at Step 601 of FIG. 12 was a predicted value calculated using the value of the internal resistance R of the battery 702 or the like. On the other hand, since the value of the change-point state of charge SOC_change calculated at Step 605 of FIG. 12 is calculated for when the closed-circuit voltage CCV of the battery 702 actually coincides with the limit voltage V_lim, it is an actually measured value of the change-point state of charge SOC_change.

Thus, in a more preferred embodiment, the charge coefficient of the internal resistance R of the battery 702 stored in the memory area of the nonvolatile memory for the memory 719 is corrected using the value of the change-point state of charge SOC_change calculated at Step 605 of FIG. 12. That is, at Step 606 of FIG. 12, the operation unit 718 corrects the charge coefficient of the internal resistance of the battery 702 stored in the memory area of the nonvolatile memory for the memory 719, based on the difference between the value of the change-point state of charge SOC_change calculated at Step 605 of FIG. 12, and the value of the change-point state of charge SOC_change calculated at Step 601 of FIG. 12.

Next, at Step 607 of FIG. 12, the gradient 'a' calculated in accordance with the above (equation 11) is recalculated using the value of the change-point state of charge SOC_change calculated at Step 605 of FIG. 12. Further, the value of the charging current Icv for the constant voltage charge (CV charge) calculated in accordance with the above (equation 12) is recalculated. During the period for the constant voltage charge (CV charge), the values of the calculated charging current Icv and the actually-measured charging current Icv are compared with each other. When there is a large difference therebetween, the charging current Icv is corrected by correcting the full charge capacity Qmax, for example, thereby allowing the actually-measured value and the calculated value to approach each other, whereby the accuracy of calculation of the next constant voltage charging time is improved. The corrected full charge capacity Qmax is capable of being stored in the nonvolatile memory and utilized next time. Using the value of the charging current Icv for the constant voltage charge (CV charge) recalculated as part of step 607 using the above (equation 12), the operation unit 718 recalculates the value of the charging time Tcv for the constant voltage charge (CV charge) in accordance with the above (equation 10).

Thus, after Step 607 of FIG. 12, the value of the charging time Tcv for the constant voltage charge (CV charge) recalculated at Step 607 of FIG. 12 can be represented in the simplified display 751 or by the detailed display screen 750 like the monitor display of FIG. 3 as the remaining charge time.

Third Embodiment

Figure 13:
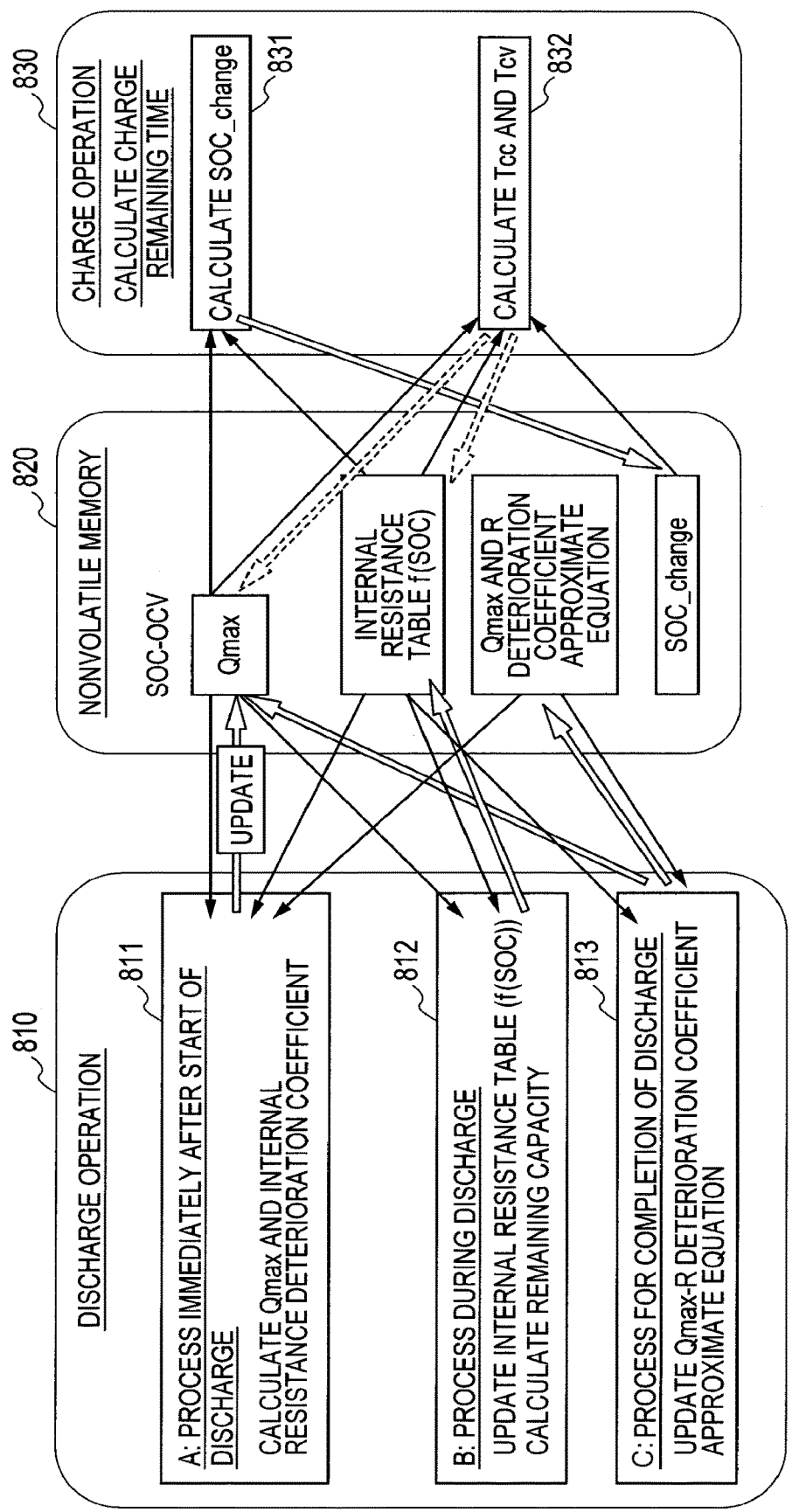
FIG. 13 is a diagram showing the relationship between the operation at the discharge of the battery 702 in FIG. 6 according to the first embodiment of the present invention using the semiconductor integrated circuit 703 for battery control shown in FIG. 1, the stored content of nonvolatile memory for a memory 719, and the operation at the charge of the battery 702, which has been described in FIGS. 9 through 12 according to a second embodiment of the present invention.

FIG. 13 is a diagram showing the relationship between the operation at the discharge of the battery 702 in FIG. 6 according to the first embodiment of the present invention using the semiconductor integrated circuit 703 for battery control shown in FIG. 1, the stored content of nonvolatile memory for the memory 719, and the operation at the charge of the battery 702, which has been described in FIGS. 9 through 12 according to the second embodiment of the present invention.

The discharge operation 810, the stored content 820 of nonvolatile memory for the memory 719, and the charge operation 830 for charging the battery 702 are interrelated.

The discharge operation 810 begins with Process A 811, which commences immediately after the start of discharge. Process A uses, as inputs, the following: (a) the relation between an open-circuit voltage OCV of the battery 702 and a state of charge SOC thereof at the stored content 820 of nonvolatile memory for the memory 719, and the internal resistance table 761 (f(SOC)), (b) the initial value of a full charge capacity Qmax, and (c) an approximate expression of the full charge capacity Qmax and an internal resistance deterioration coefficient. As output, Process A updates the value of the full charge capacity Qmax in the nonvolatile memory, based on the stored content 820 of nonvolatile memory for the memory 719.

Next, the discharge operation 810 continues with Process B 812. Process B uses, as inputs, the following: (a) the relation between the open-circuit voltage OCV of the battery 702 and the state of charge SOC thereof at the stored content 820 of nonvolatile memory for the memory 719, and the internal resistance table 761 (f(SOC)), and (b) the full charge capacity Qmax. As output, Process B updates the internal resistance table 761 (f(SOC)) in the nonvolatile memory, based on the stored content 820 of nonvolatile memory for the memory 719.

The discharge operation 810 then continues with Process C 813, which may take place after a few hours have elapsed after the end of discharge of the battery 702 (i.e., after the end of Process B). Process C uses, as inputs, the following: (a) the relation between the open-circuit voltage OCV of the battery 702 and the state of charge SOC thereof at the stored content 820 of nonvolatile memory for the memory 719, which may be stored in the internal resistance table 761 (f(SOC)), and (b) the approximate expression of the full charge capacity Qmax and the internal resistance deterioration coefficient. As output, Process C updates the approximate expression of the full charge capacity Qmax and internal resistance deterioration coefficient, based on the stored content 820 of nonvolatile memory for the memory 719.

The charge operation 830 for charging the battery 702 includes (a) calculations of the change-point state of charge SOC_change and (b) calculations of a first charging time Tcc for the constant current charge (CC charge) and a second charging time Tcv for the constant voltage charge (CV charge).

The change-point state of charge SOC_change is first calculated using the internal resistance charge coefficient, the internal resistance table 761 (f(SOC)) and the full charge capacity Qmax at the stored content 820 of nonvolatile memory for the memory 719 (process 831). The calculated change-point state of charge SOC_change is stored in the nonvolatile memory for the memory 719.

After the change-point state of charge SOC_change has been calculated, the charging time Tcc for the constant current charge (CC charge) and the charging time Tcv for the constant voltage charge (CV charge) are calculated using the full charge capacity Qmax and the change-point state of charge SOC_change, both of which are stored in the nonvolatile memory for the memory 719 (process 832).

After the charge operation 830, the internal resistance table 761 (f(SOC)) and the full charge capacity Qmax can also be updated as indicated by broken-line arrows shown in FIG. 13.

While the invention made above by the present inventors has been described specifically on the basis of the various embodiments, the present invention is not limited to the embodiments referred to above. It is needless to say that various changes can be made thereto within the scope not departing from the gist thereof.

For example, the present invention can be applied not only to a battery for a note PC but also to a semiconductor integrated circuit for battery control, which is used in a PDA (Personal Digital Assistant), a hand-held game console, a cellular phone and the like.

What is claimed is:

1. A method of operating a semiconductor integrated circuit including a battery control function configured to control a battery, the method comprising the steps of:
   (a) storing a relation between a full charge capacity and an internal resistance deterioration coefficient of the battery in a memory unit;
   (b) supplying current information and voltage information of the battery to the semiconductor integrated circuit; and
   (c) storing the full charge capacity and an internal resistance deterioration coefficient of the battery in the memory unit when a voltage-based state of charge and a current-based state of charge have a same value.

2. A method of operating a semiconductor integrated circuit according to claim 1, wherein the semiconductor integrated circuit comprises:
   the memory unit;
   a current integrating unit;
   a voltage-based state of charge operating unit;
   a current-based state of charge operating unit;
   a comparison determination unit;
   a correcting unit, and
   a resistance deterioration coefficient output unit.

3. The method of operating a semiconductor integrated circuit according to claim 1, comprising, after step (b):
   determining a voltage-based state of charge;
   determining a current-based state of charge;
   determining a comparison output signal based on the voltage-based state of charge and the current-based state of charge;
   calculating a corrected value of the full charge capacity, based on an initial value of the full charge capacity and the comparison output signal; and
   calculating an internal resistance deterioration coefficient, in response to the corrected value of the full charge capacity.

4. The method of operating a semiconductor integrated circuit according to claim 3, further comprising, in step (c), storing:
   the corrected calculated value of the full charge capacity; and
   either the voltage-based state of charge as the initial value of the full charge capacity, or the current-based state of charge as the initial value of the current-based state of charge, or both.

5. The method of operating a semiconductor integrated circuit according to claim 3, further comprising:
   calculating a state of charge available, a remaining capacity and a remaining time of the battery, based on the corrected full charge capacity and the internal resistance deterioration coefficient.

6. The method of operating a semiconductor integrated circuit according to claim 3, further comprising:
   determining a resistance parameter of the internal resistance of the battery, in response to the voltage-based state of charge;
   during discharge of the batter, calculating the internal resistance of the battery, based on a closed-circuit voltage of the battery and a discharging current of the battery; and
   updating a method of outputting the resistance parameter of the internal resistance of the battery in accordance with the result of calculating the internal resistance of the battery.

7. The method of operating a semiconductor integrated circuit according to claim 6, further comprising:
   calculating the full charge capacity of the battery, based on a state of charge calculated based on an open-circuit voltage of the battery, when a few hours have elapsed after the end of discharge of the battery, and an integrated value of the discharging current of the battery generated during the discharge of the battery,
   calculating the internal resistance deterioration coefficient, based on current and voltage values of the battery during the discharge of the battery, and
   updating the relation between the full charge capacity and the internal resistance deterioration coefficient, based on the result of calculation of the full charge capacity when the few hours have elapsed after the end of discharge of the battery, and the result of calculation of the internal resistance deterioration coefficient during the discharge of the battery.

8. The method of operating a semiconductor integrated circuit according to claim 6, wherein in a charge operation, the battery is charged with a constant current for a first portion of the charge and the battery is charges with a constant voltage for a latter portion of the charge, and the method further comprises
   calculating a state of charge at a change point when the constant current charge is switched to the constant voltage charge,
   calculating a constant current charging time (Tcc) for the constant current charge and a calculating a constant voltage charging time (Tcv) for the constant voltage charge from the change-point state of charge, and
   outputting a sum of the constant current charging time (Tcc) and the constant voltage charging time (Tcv) as a remaining charge time.

9. The method of operating a semiconductor integrated circuit according to claim 8, comprising:
   calculating the constant voltage charging time (Tcv) based on the state of charge of the battery and a linear approximation of the charging current for the constant voltage charge.

10. The method of operating a semiconductor integrated circuit according to claim 9, comprising:
    calculating the change-point state of charge based on either:
    (i) a timing at which the closed-circuit voltage taken during the period of the constant voltage charge of the battery coincides with a limit voltage for the constant voltage charge, or
    (ii) a timing at which the charging current taken during the period of the constant voltage charge of the battery coincides with a constant current for the constant current charge;
    updating the change-point state of charge to an actual change-point state of charge calculated based on a change from the constant current charge to the constant voltage charge during the actual charge of the battery, and recalculating the constant voltage charging time (Tcv) by using the actual change-point state of charge to thereby update an output value of the remaining charging time.

\* \* \* \* \*